(12) United States Patent
Wang

(10) Patent No.: US 7,344,898 B2
(45) Date of Patent: Mar. 18, 2008

(54) METHOD FOR MANUFACTURING SEMICONDUCTOR DEVICE

(75) Inventor: Wensheng Wang, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 168 days.

(21) Appl. No.: 11/222,871

(22) Filed: Sep. 12, 2005

(65) Prior Publication Data

US 2006/0216954 A1   Sep. 28, 2006

(30) Foreign Application Priority Data

Mar. 28, 2005   (JP)   ............................. 2005-092944

(51) Int. Cl.
*H01L 21/00* (2006.01)
*H01L 21/338* (2006.01)
*H01L 21/469* (2006.01)

(52) U.S. Cl. .................... 438/3; 438/167; 438/197; 438/201; 438/482; 438/486; 438/509; 438/785; 275/278; 275/390; 275/E21.664; 275/E21.272; 275/E21.009

(58) Field of Classification Search .................... 438/3, 438/197, 201, 482, 486, 509, 167, 785; 257/278, 257/390, E21.664, E21.272, E21.009
See application file for complete search history.

(56) References Cited

U.S. PATENT DOCUMENTS

| | | | | |
|---|---|---|---|---|
| 5,021,100 A | * | 6/1991 | Ishihara et al. | ............. 136/249 |
| 6,287,637 B1 | | 9/2001 | Chu et al. | |
| 6,351,006 B1 | * | 2/2002 | Yamakawa et al. | ......... 257/310 |
| 6,964,873 B2 | * | 11/2005 | Matsuura et al. | .............. 438/3 |
| 7,030,450 B2 | * | 4/2006 | Lee et al. | .................... 257/411 |
| 7,078,242 B2 | * | 7/2006 | Matsuura et al. | .............. 438/3 |
| 7,148,530 B2 | * | 12/2006 | Shin et al. | ................... 257/295 |
| 2002/0177243 A1 | * | 11/2002 | Matsuura et al. | .............. 438/3 |
| 2004/0092073 A1 | * | 5/2004 | Cabral et al. | ............... 438/287 |
| 2005/0106761 A1 | * | 5/2005 | Lee et al. | ...................... 438/3 |
| 2005/0136555 A1 | * | 6/2005 | Wang | ............................. 438/3 |
| 2005/0136556 A1 | * | 6/2005 | Matsuura et al. | .............. 438/3 |
| 2006/0151852 A1 | * | 7/2006 | Senzaki | ....................... 257/532 |
| 2006/0199327 A1 | * | 9/2006 | Sakata | ........................ 438/216 |

FOREIGN PATENT DOCUMENTS

| | | |
|---|---|---|
| JP | 11-54716 | 2/1999 |
| JP | 2001-126955 | 5/2001 |
| JP | 2001-189433 | 7/2001 |
| JP | 2002-203914 | 7/2002 |

\* cited by examiner

*Primary Examiner*—Michael Lebentritt
*Assistant Examiner*—Mohsen Ahmadi
(74) *Attorney, Agent, or Firm*—Westerman, Hattori, Daniels & Adrian, LLP.

(57) ABSTRACT

After a bottom electrode film is formed, a ferroelectric film is formed on the bottom electrode film. Then, a heat treatment is performed for the ferroelectric film in an oxidizing atmosphere so as to crystallize the ferroelectric film. Then, a top electrode film is formed on the ferroelectric film. In the heat treatment (i.e., annealing for crystallization), a flow rate of oxidizing gas is set to be in a range of from 10 sccm to 100 sccm.

19 Claims, 40 Drawing Sheets

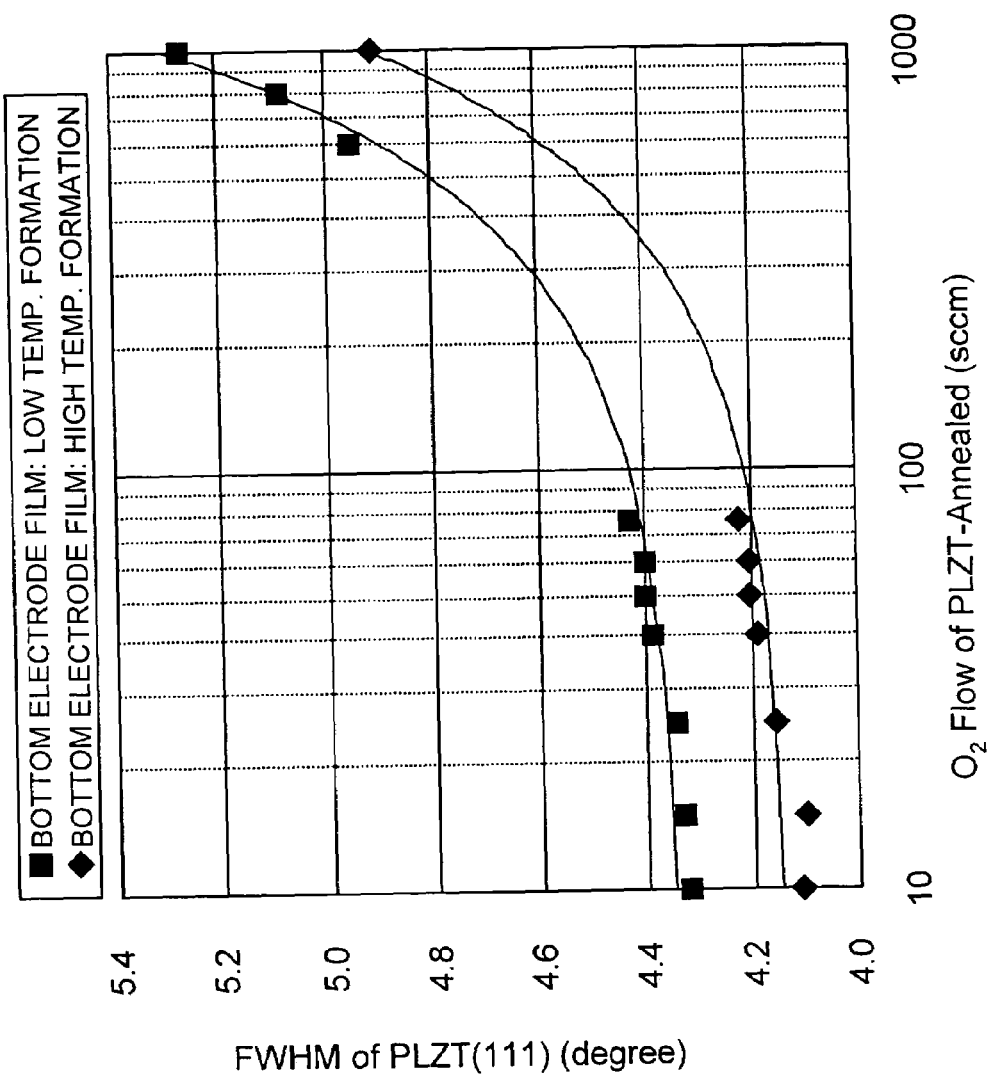

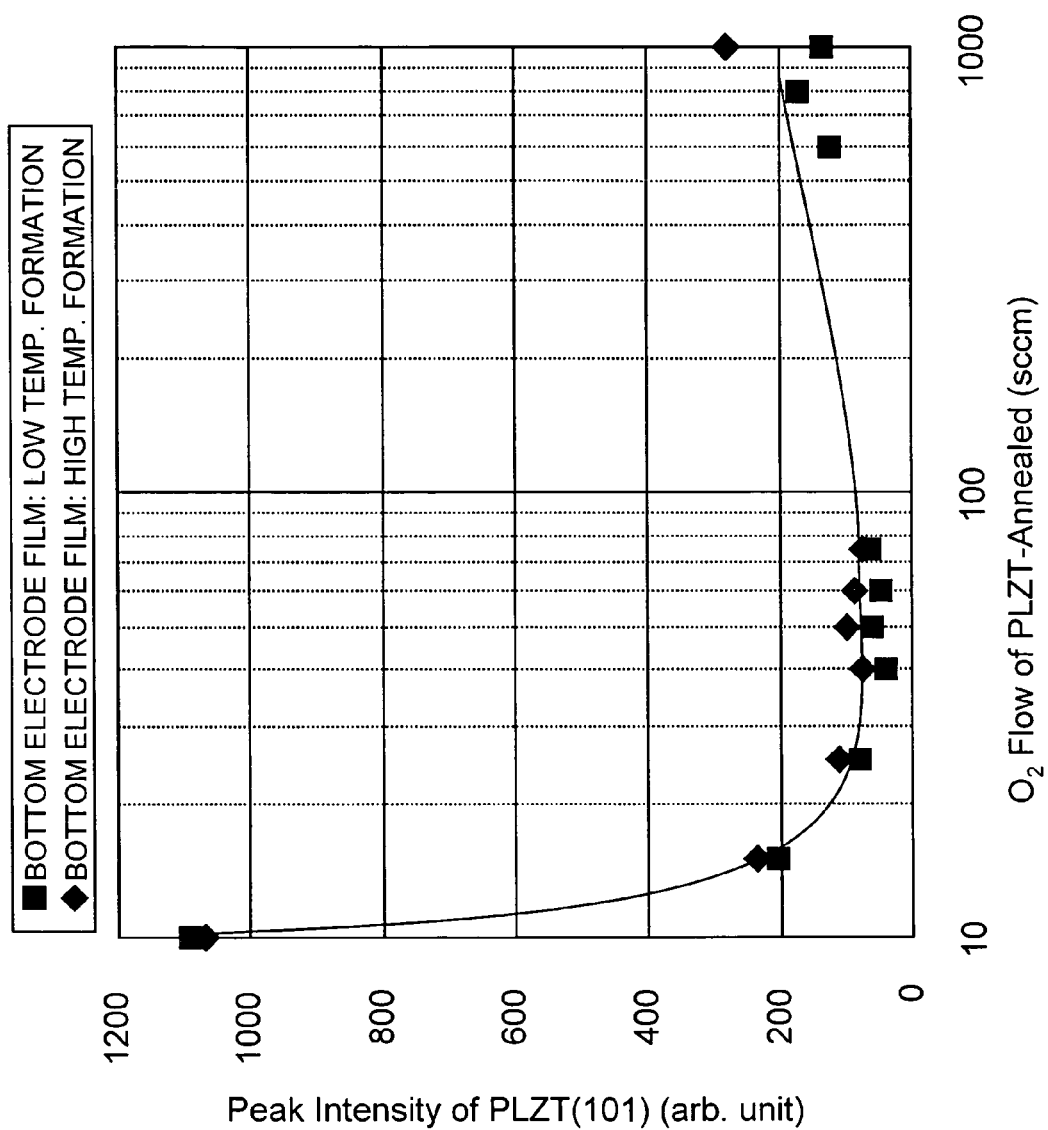

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2005-092944, filed on Mar. 28, 2005, the entire contents of which are incorporated herein by reference.

BACKGROUND OF THE INVENTION

1. Field of the Invention

The present invention relates to a method for manufacturing a semiconductor device suitable for a ferroelectric memory.

2. Description of the Related Art

In recent years, a tendency of processing or storing large-volume data at high speeds has become higher with development of digital techniques. This requires a semiconductor device for use in electronics to be more highly integrated and have a higher performance.

For the semiconductor device, research and development of a technique for achieving a highly integrated DRAM has started, for example. This technique uses a ferroelectric material or a high dielectric constant material for a capacitor-insulation film of a capacitor forming the DRAM, in place of silicon oxide or silicon nitride that is conventionally used.

Moreover, research and development of a technique have also started, which uses a ferroelectric film having spontaneous polarization characteristics as the capacitor-insulation film in order to achieve a nonvolatile RAM for which writing and reading can be performed at a low voltage and at high speeds. This type of semiconductor device is called as a ferroelectric memory (FeRAM).

The ferroelectric memory stores information by using ferroelectric hysteresis. The ferroelectric memory includes a ferroelectric capacitor that is formed with a pair of electrodes and a ferroelectric film sandwiched between the electrodes as a capacitor-dielectric film. In the ferroelectric film, polarization occurs in accordance with a voltage applied across the electrodes and spontaneous polarization is kept even after the applied voltage is removed. When the polarity of the applied voltage is inverted, the polarity of the spontaneous polarization is also inverted. Therefore, information can be read out by detecting the spontaneous polarization. The ferroelectric memory can operate at a lower voltage than a flash memory and allows high-speed writing to be performed while saving a power.

PZT ferroelectric materials, compounds having a Bi-layered structure, and the like are used for the ferroelectric film. As the PZT ferroelectric materials, lead zirconium titanate (PZT) itself, PZT in which La, Ca, Sr, and/or Si is doped, and the like can be used. As the Bi-layered structure compounds, $SrBi_2Ta_2O_9$ (SBT, Y1) and $SrBi_2(Ta, Nb)_2O_9$ (SBTN, YZ) can be used, for example. Those films are formed on a bottom electrode film in an amorphous state by a sol-gel method, sputtering, MOCVD, or the like, and are then crystallized by a heat treatment.

The heat treatment for crystallization is performed by furnace annealing using an annealing furnace or RTA (Rapid Thermal Annealing) using a lamp annealing apparatus. The heat treatment is typically performed at a temperature of 600° C. or higher (e.g., 700° C.) for 60 seconds. In case of furnace annealing, huge crystal grains in which the ferroelectric material is oriented in a direction in which polarization cannot be controlled by an applied voltage may be generated. On the other hand, in case of RTA, generation of such huge crystal grains occurs less easily, as compared with the case of furnace annealing.

Japanese Patent Application Laid-Open No. Hei 11-54716 (Patent document 1) describes annealing in an oxygen atmosphere performed after formation of the PZT film. This annealing is performed by using an RTA apparatus or a resistance furnace at a temperature of 700° C. or higher.

Japanese Patent Application Laid-Open No. 2001-189433 (Patent document 2) describes that, in order to improve shot fail and leak current characteristics, rapid thermal annealing is performed in an oxygen atmosphere at a temperature range of from approximately 700° C. to 800° C. for approximately 20 to 60 seconds after formation of the PZT film, a top electrode is then formed, and thereafter a heat treatment is performed in a furnace in an oxygen atmosphere at a temperature range of from approximately 755° C. to 825° C. for 30 to 90 minutes.

Japanese Patent Application Laid-Open No. 2002-203914 (Patent document 3) describes that annealing is performed twice after the bottom electrode, the PZT film, and the top electrode are formed in order to improve leak current characteristics and dielectric characteristics of the capacitor. The first annealing is performed in an oxygen atmosphere at a temperature range of from 200° C. to 600° C. The second annealing is performed in an oxygen-free atmosphere at a temperature range of from 300° C. to 900° C.

U.S. Pat. No. 6,287,637 (Patent document 4) describes that, when the PZT film is crystallized, annealing is performed twice in order to increase the amount of switching charges and reduce a saturation coercive voltage and fatigue loss. The first annealing is performed in an atmosphere of inert gas containing a small amount of oxygen gas at 600° C. for 90 seconds. The second annealing is performed in an oxygen atmosphere at a temperature range of from 725° C. to 750° C. for 20 seconds.

Japanese Patent Application Laid-Open No. 2001-126955 (Patent document 5) describes that annealing is performed twice in a similar manner to that described in Patent document 4.

However, none of the above conventional methods can sufficiently bring out the characteristics of the ferroelectric film, when the thickness of the ferroelectric film is about 150 nm or less.

[Patent document 1] Japanese Patent Application Laid-Open No. Hei 11-54716

[Patent document 2] Japanese Patent Application Laid-Open No. 2001-189433

[Patent document 3] Japanese Patent Application Laid-Open No. 2002-203914

[Patent document 4] U.S. Pat. No. 6,287,637

[Patent document 5] Japanese Patent Application Laid-Open No. 2001-126955

SUMMARY OF THE INVENTION

It is an object of the present invention to provide a semiconductor device and a method for manufacturing the same, which can sufficiently bring out characteristics of a ferroelectric film even if the ferroelectric film is thin.

It is very important to control orientation of the ferroelectric film in order to sufficiently bring out the characteristics thereof. Table 1 shows yield and distribution of failure bits in a 2T2C ferroelectric memory after high-temperature baking. In each sample of that ferroelectric memory, a Pt film was formed as a bottom electrode film in three different methods and thereafter a PLZT film having a thickness of 200 nm was formed on the Pt film. Then, annealing for crystallization was performed for the samples under the same condition. Subsequently, an iridium oxide film was formed as a top electrode film. For each of the thus obtained samples, a full width at half maximum in a rocking curve (a rocking curve full width at half maximum: FWHM) for a (111) plane was measured for each of the Pt film and the PLZT film at five in-plane points by four-axis X-ray diffraction and then an average value for those five points was obtained. When Samples A, B, and C are compared with one another, the smallest FWHM was obtained for Sample C for both the Pt film and the PLZT film.

TABLE 1

|  | Sample A | Sample B | Sample C |
| --- | --- | --- | --- |
| 10000 failure bits | 0 | 2 | 1 |
| 1000 failure bits | 1 | 0 | 1 |
| 100 failure bits | 19 | 1 | 1 |
| 10 failure bits | 41 | 16 | 12 |
| 1 failure bit | 11 | 33 | 23 |
| Pass | 28 | 48 | 63 |
| FWHM of Pt(111) | 4.299 | 3.347 | 3.258 |
| FWHM of PLZT(111) | 7.735 | 5.206 | 5.113 |

256 kbit 2T2C ferroelectric memories were manufactured by using the above capacitors, respectively. For the thus manufactured ferroelectric memories, yield and distribution of failure bits were obtained. More specifically, writing (SS: same state) was performed at 2.5 V for the ferroelectric memory at a room temperature (24° C.) and thereafter a heat treatment was performed in a 250° C.-furnace for 30 minutes. Then, the temperature was lowered to the room temperature. Reading (SS) was performed at 2.5 V at the room temperature. Table 1 shows this result. "Pass" represents a ratio of ferroelectric memories for which proper reading could be performed. "1 failure bit," "10 failure bits," "100 failure bits," "1000 failure bits," and "10000 failure bits" represent ratios of ferroelectric memories in which the numbers of bits for which failure occurred during reading were 1 bit, 2 to 10 bits, 11 to 100 bits, 101 to 1000 bits, and 1001 to 10000 bits, respectively.

As shown in Table 1, as FWHM is smaller and the crystallinity of the Pt film and that of the PLZT film are better, the number of failure bits is smaller.

However, according to the conventional technique, the characteristics of the ferroelectric film cannot be sufficiently brought out when the ferroelectric film is as thin as about 150 nm, as described above. FIG. 32 is a graph showing a measurement result of FWHM of a (111) plane of a PLZT film in a ferroelectric capacitor formed with a conventional method. The result was obtained by four-axis X-ray diffraction performed for samples. Each of the samples was manufactured with forming a PLZT film on a bottom electrode of a multilayer structure of a Pt film and a Ti film, and then performing annealing twice in the way described in the Patent document 5. As shown in FIG. 32, even if conditions for the annealing for crystallization were the same, the crystallinity of the PLZT film highly depended on its thickness. That is, the crystallinity of the PLZT film was lowered as the thickness thereof was reduced.

FIG. 33 is a graph showing a measurement result of the switching charge amount in a ferroelectric capacitor formed with the conventional method. Sample D (♦) corresponds to a ferroelectric capacitor in which its planar shape is a square having a 50-μm long side (discrete). Sample E (▲) corresponds to a ferroelectric capacitor obtained with adding one wiring layer to Sample D. Sample F (■) corresponds to a ferroelectric capacitor (cell array). The switching charge amount $Q_{SW}$ is a value obtained by Expression 1 using Values P, U, N, and D obtained from a hysteresis loop shown in FIG. 35. The measurement of the switching charge amount was performed for 40 points on two wafers.

(Expression 1)

$$Q_{SW} = \frac{(P - U) + (N - D)}{2}$$

When the thickness of the PLZT film was 200 nm, the measurement result was not largely different between Samples D and E. This means that no degradation of the ferroelectric capacitor occurred in the manufacturing process. However, when the thickness of the PLZT film was 150 nm or less, the switching charge amount was largely reduced in Samples E and F. It is considered that degradation of the ferroelectric capacitor occurred in the manufacturing process.

FIG. 34 is a graph showing a coercive voltage Vc in Sample F. In the measurement of the coercive voltage Vc, a hysteresis loop representing a relationship between an applied voltage and polarization amount, as shown in FIG. 35, was obtained and various values were obtained from the hysteresis loop. After a relationship between the applied voltage and Value P was obtained, an applied voltage at which a ratio of change of Value P to change of the applied voltage was the largest was determined as the coercive voltage Vc. The symbol ♦ represents a coercive voltage Vc(−) for which the change ratio is negative, and the symbol ▲ represents a coercive voltage Vc(+) for which the change ratio is positive. In general, as the coercive voltage is lower, a lower voltage operation is possible. In Sample F manufactured with the conventional method, when the thickness of the PLZT film was reduced from 200 nm to 150 nm, the coercive voltage Vc was lowered. However, the coercive voltage Vc was lowered little even when the thickness of the PLZT film was further reduced.

Accordingly, the present invention aims to bring out the characteristics of the ferroelectric film by improving the crystallinity of the ferroelectric film such as a PLZT film.

In a method for manufacturing a semiconductor device according to the present invention, a bottom electrode film is formed and thereafter a high dielectric constant film such as a ferroelectric film is formed on the bottom electrode film. Then, a heat treatment is performed for the high dielectric constant film in an oxidizing atmosphere to crystallize the high dielectric constant film. Then, a top electrode film is formed on the high dielectric constant film. In the heat treatment, a flow rate of oxidizing gas is set to be in a range of from 10 sccm to 100 sccm.

BRIEF DESCRIPTION OF THE DRAWINGS

FIG. 3 is a graph showing a rocking curve full width at half maximum (FWHM) of a (111) plane.

FIG. 4 is a graph showing a peak intensity of a (101) plane.

DETAILED DESCRIPTION OF THE PREFERRED EMBODIMENTS

Figure 1:
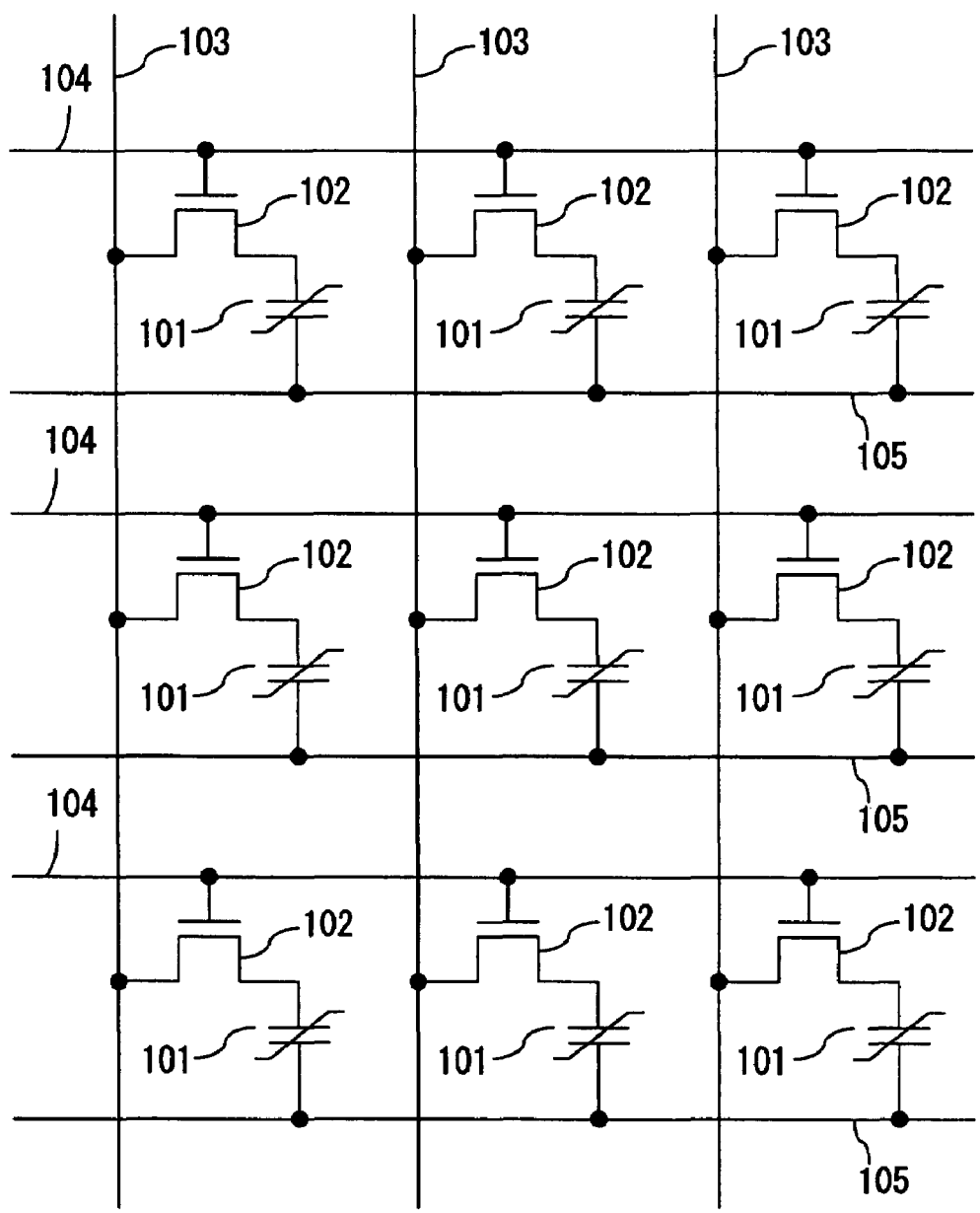
FIG. 1 is a circuit diagram showing the configuration of a memory cell array of a ferroelectric memory to be manufactured by a method according to an embodiment of the present invention.

Hereinafter, preferred embodiments of the present invention will be described specifically with reference to the accompanying drawings. FIG. 1 is a circuit diagram showing the configuration of a memory cell array of a ferroelectric memory (semiconductor device) to be manufactured by a method according to an embodiment of the present invention.

The memory cell array includes a plurality of bit lines 103 extending in a single direction, a plurality of word lines 104 and plate lines 105 extending in the direction perpendicular to the direction of extension of the bit lines 103. In alignment with the lattices formed by the bit lines 103, the word lines 104 and the plate lines 105, a plurality of memory cells of the ferroelectric memory are placed in an array shape. Each of the memory cells is provided with a ferroelectric capacitor (storage portion) 101 and a MOS transistor (switching portion) 102.

A gate of the MOS transistor 102 is connected to the word lines 104. Further, one of the source and drain of the MOS transistors 102 is connected to the bit line 103 and the other of the source and drain of the MOS transistors 102 is connected to one of the electrodes of the ferroelectric capacitor 101. Further, the other electrode of the ferroelectric capacitor 101 is connected to the plate line 105. Further, the respective word lines 104 and the respective plate lines 105 are shared by the plurality of MOS transistors 102 arranged in the same direction as the direction of extension thereof. Similarly, the respective bit lines 103 are shared by the plurality of MOS transistors 102 arranged in the same direction as the direction of extension thereof. The direction of extension of the word lines 104 and the plate lines 105 and the direction of extension of the bit lines 103 may be referred to as row and column directions, respectively. However, the placement of the bit lines 103, the word lines 104 and the plate lines 105 are not limited to that which has been previously described.

The memory cell array of the ferroelectric memory configured as described above stores data in accordance with the polarization of ferroelectric films provided in the ferroelectric capacitors 101.

Figure 2A:
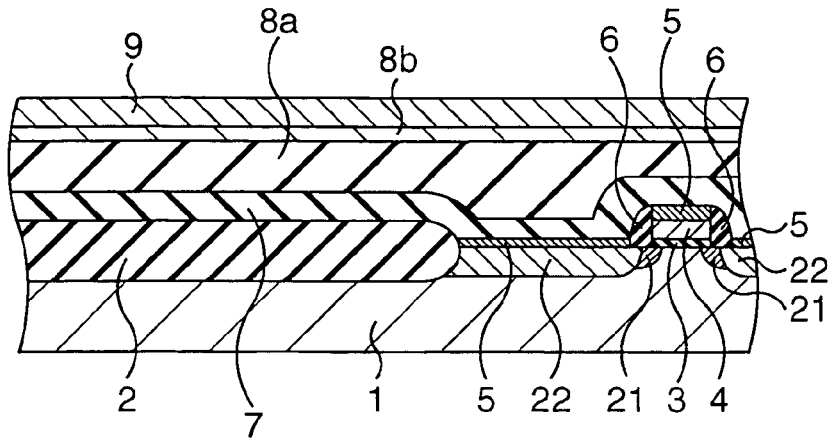
FIGS. 2A to 2N are cross-sectional views showing a method for manufacturing a ferroelectric memory according to the embodiment of the present invention in an order of processes.

Next, the embodiment of the present invention will be described. Here, for convenience, the cross sectional structure of a semiconductor device will be described along with the fabrication method of the same. FIGS. 2A to 2N are cross-sectional views showing a method for manufacturing a ferroelectric memory (semiconductor device) according to the embodiment of the present invention in an order of processes.

First, an isolation insulation film 2 sectioning an element active region is formed in a surface of a semiconductor substrate 1 such as a Si substrate by LOCOS (Local Oxidation of Silicon), for example, as shown in FIG. 2A. Then, a transistor (MOSFET) is formed in the element active region sectioned by the isolation insulation film 2. The MOSFET includes a gate insulation film 3, a gate electrode 4, a silicide layer 5, a sidewall 6, and source and drain diffused layers with a lightly diffused layer 21 and a heavily diffused layer 22. A SiO$_2$ film having a thickness of about 100 nm is formed as the gate insulation film 3 by thermal oxidation, for example. Then, a silicon oxynitride film 7 is formed on the entire surface of the substrate 1 so as to cover the MOSFET and thereafter a silicon oxide film 8a is also formed on the entire surface of the substrate 1. The silicon oxynitride film 7 is formed in order to prevent deterioration of the gate insulation film 3 and the like caused by hydrogen generated during formation of the silicon oxide film 8a. A TEOS (tetraethylorthosilicate) film having a thickness of about 700 nm is formed as the silicon oxide film 8a by CVD, for example.

Then, annealing is performed in an $N_2$ atmosphere at 650° C. for 30 minutes to degas the silicon oxide film 8a. Then, a Ti film 8b having a thickness of from about 20 nm is formed on the silicon oxide film 8a by sputtering, for example. The Ti film 8b serves as an adhesion layer for a bottom electrode film. An aluminum oxide film, a titanium oxide film, or the like that has a thickness of about 20 nm may be formed as the adhesion layer. Then, a bottom electrode film 9 is formed on the Ti film 8b. A Pt film having a thickness of about 180 nm is formed as the bottom electrode film 9 by sputtering, for example.

Figure 2B:
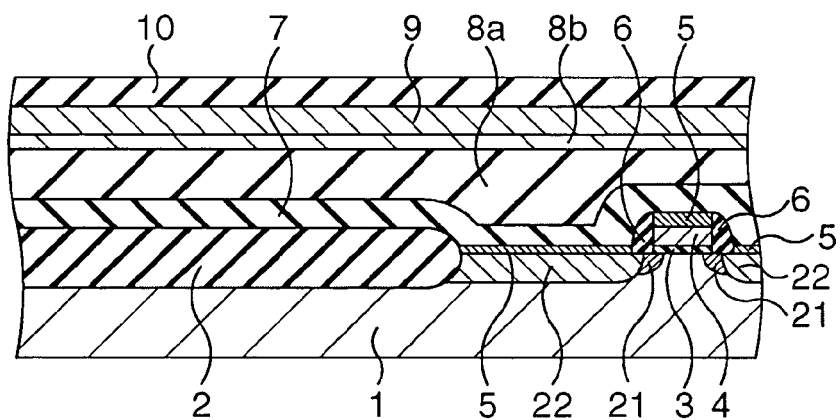

As shown in FIG. 2B, a ferroelectric film 10 in an amorphous state is then formed on the bottom electrode film 9. The ferroelectric film 10 may be formed in a microcrystalline state. For example, a PLZT film having a thickness of from about 100 to about 200 nm is formed as the ferroelectric film 10 by RF sputtering using a PLZT ((Pb, La)(Zr, Ti)$O_3$) target. Then, a heat treatment (RTA: Rapid Thermal Annealing) is performed in an atmosphere containing Ar and $O_2$ at 650° C. for 90 seconds and another heat treatment is performed in an oxygen atmosphere at 750° C. As a result, the ferroelectric film 10 is completely crystallized and the Pt film composing the bottom electrode film 9 is made dense, so that mutual diffusion of Pt and O around an interface between the bottom electrode film 9 and the ferroelectric film 10 can be suppressed. In the first RTA, it is preferable that a flow rate of $O_2$ gas be set to be in a range of from 10 sccm to 100 sccm, more preferably, in a range of from of 10 sccm to 50 sccm, and a flow rate of inert gas such as Ar gas be set to 1500 sccm or more.

Figure 2C:
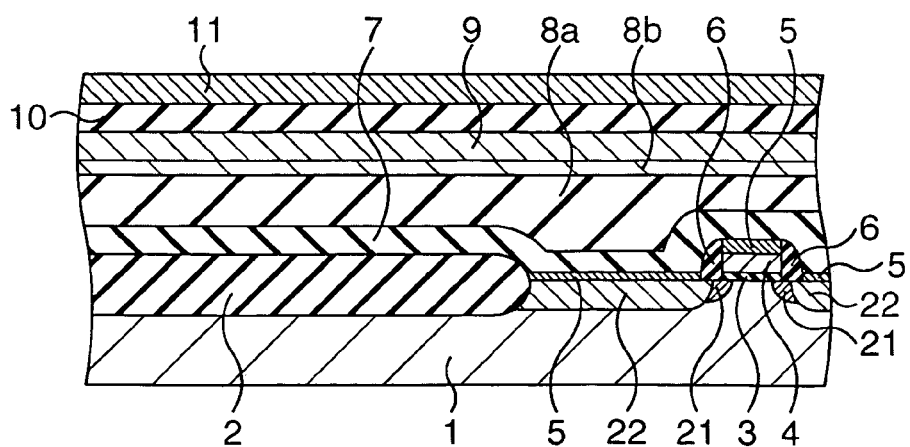

Then, a top electrode film 11 is formed on the ferroelectric film 10, as shown in FIG. 2C.

Figure 2D:
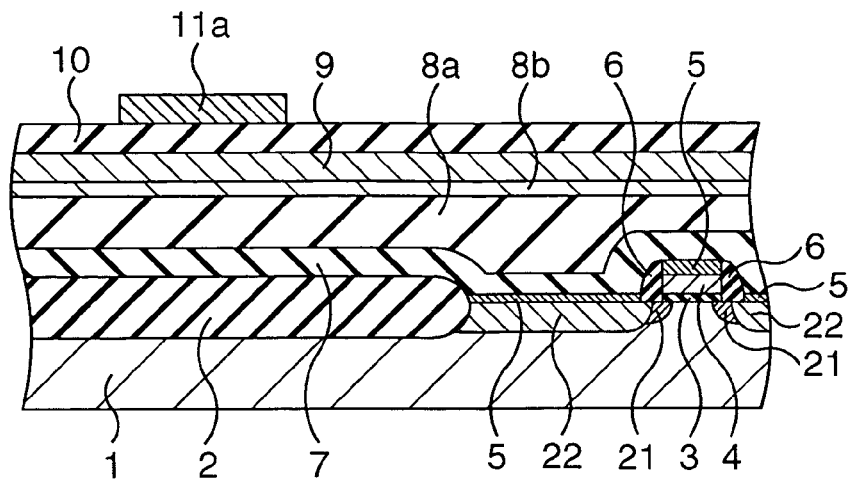

The top electrode film 11 is patterned after cleaning of a back surface of the substrate 1, thereby forming a top electrode 11a, as shown in FIG. 2D. Then, recovery annealing for recovering physical damage or the like of the ferroelectric film 10 during formation of the top electrode 11a is performed in an $O_2$ atmosphere at 650° C. for 60 minutes.

Figure 2E:
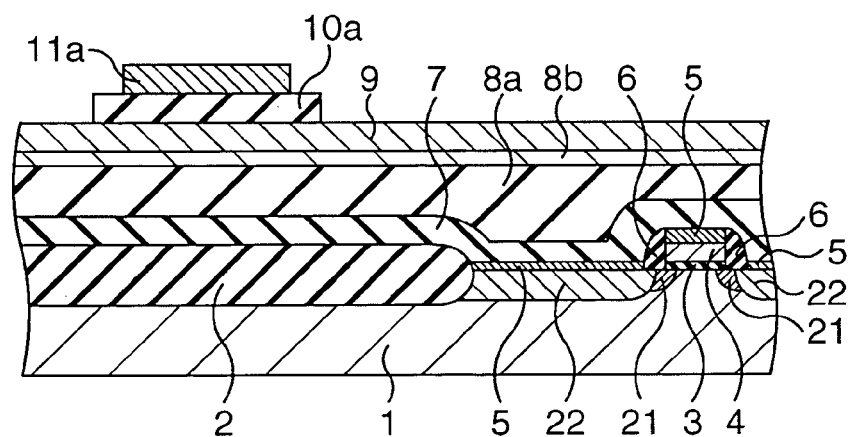

Then, a capacitor insulation film 10a is formed by patterning the ferroelectric film 10, as shown in FIG. 2E. Subsequently, oxygen annealing is performed in order to prevent an $Al_2O_3$ film formed later from being peeled off.

Figure 2F:
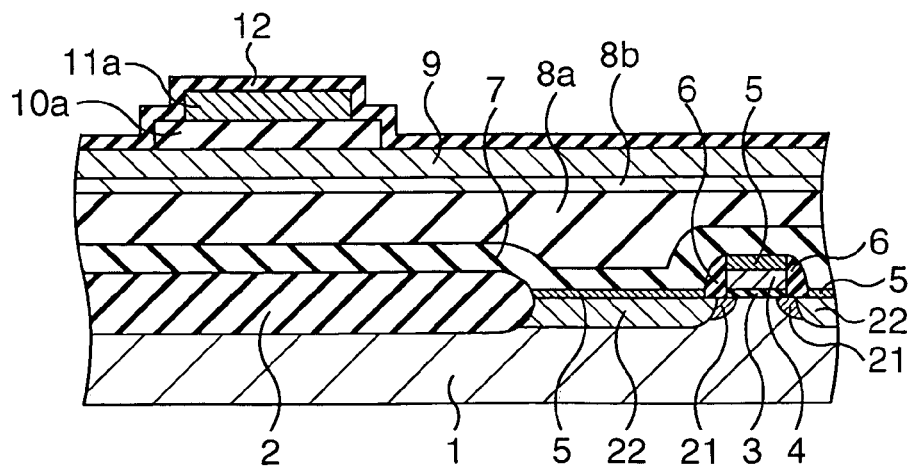

Next, an $Al_2O_3$ film 12 serving as a protection film is formed on the entire surface of the substrate 1 by sputtering, as shown in FIG. 2F. Then, oxygen annealing is performed for alleviating damage caused by sputtering. The protection layer ($Al_2O_3$ film 12) can prevent entering of hydrogen from the outside into the ferroelectric capacitor.

Figure 2G:
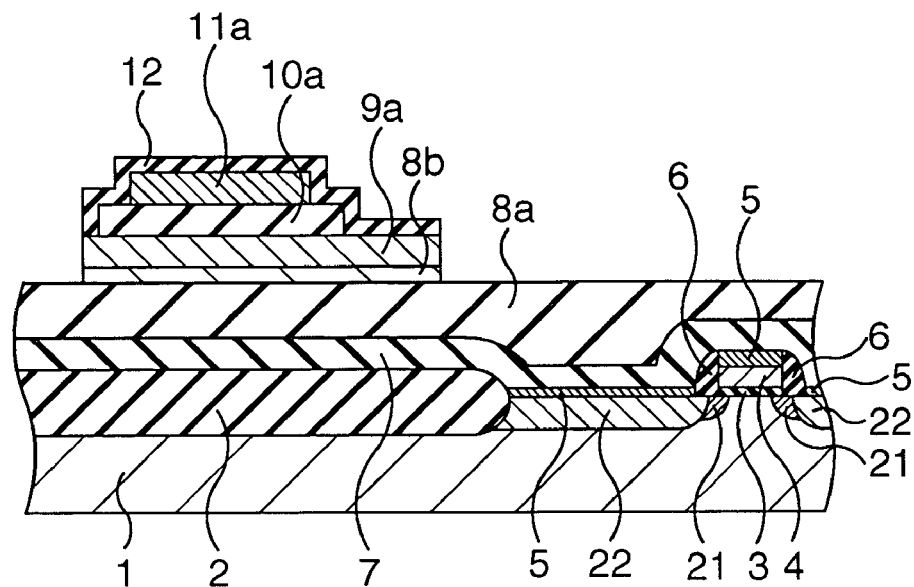

Subsequently, the $Al_2O_3$ film 12 and the bottom electrode film 9 are patterned, thereby forming a bottom electrode 9a, as shown in FIG. 2G. Then, oxygen annealing is performed for preventing an $Al_2O_3$ film formed later from being peeled off.

Figure 2H:
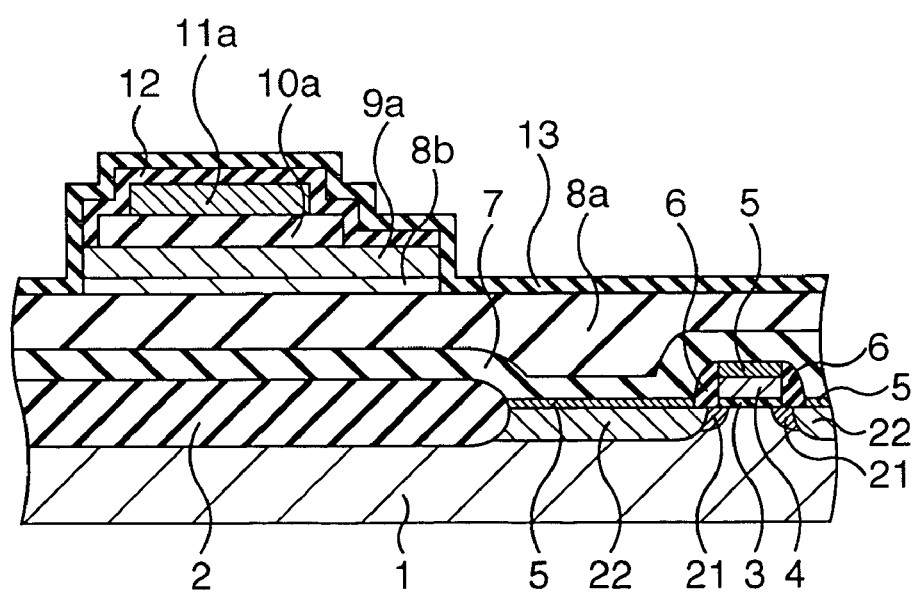

Next, an $Al_2O_3$ film 13 serving as a protection film is formed on the entire surface of the substrate by sputtering, as shown in FIG. 2H. Then, oxygen annealing is performed in order to reduce leak in a capacitor.

Figure 2I:
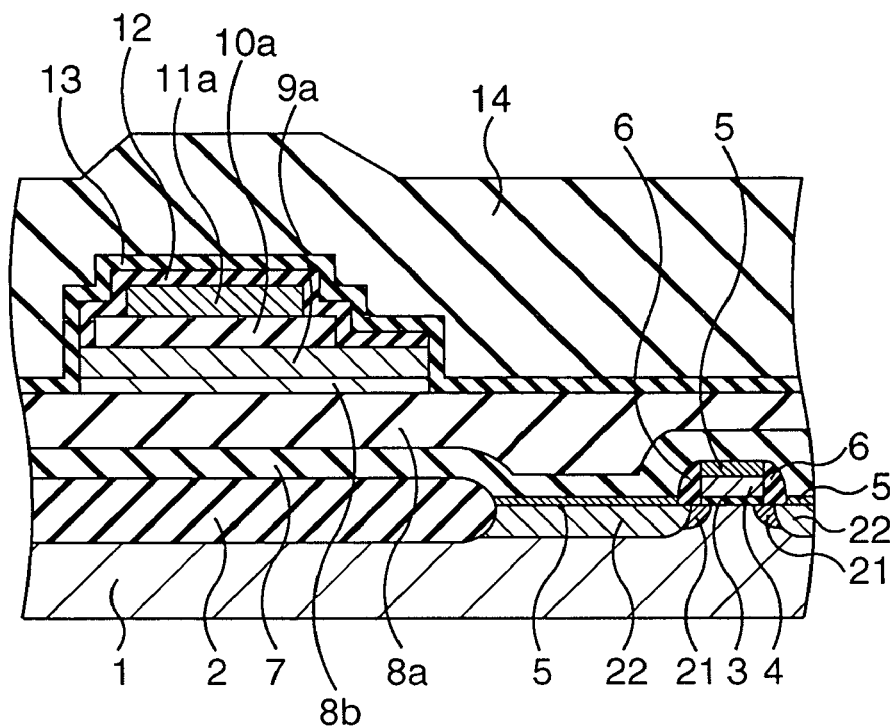

Then, an interlayer insulation film 14 is formed on the entire surface of the substrate by a high density plasma method, as shown in FIG. 2I. The thickness of the interlayer insulation film 14 is set to about 1.5 μm, for example.

Figure 2J:
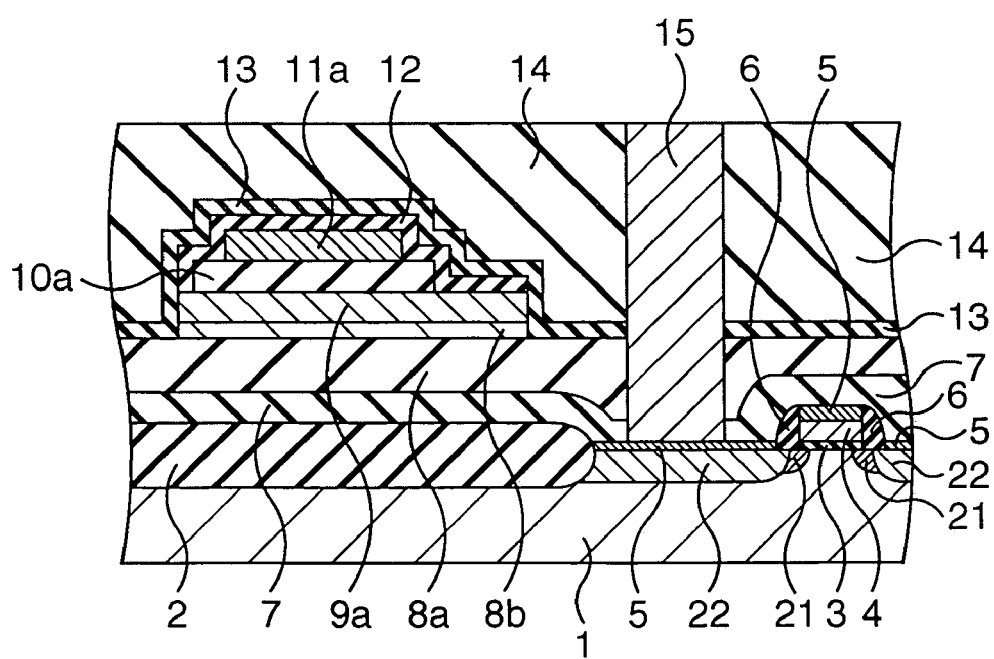

Subsequently, the interlayer insulation film 14 is flattened by CMP (Chemical Mechanical Polishing), as shown in FIG. 2J. Then, a plasma treatment using $N_2O$ gas is performed. Thus, nitriding of the interlayer insulation film 14 slightly occurs around its surface, so that it is hard for moisture to enter the inside of the interlayer insulation film 14. That plasma treatment is effective when it uses gas containing at least one of N and O. Then, a hole reaching the heavily diffused layer 22 of the transistor is formed in the interlayer insulation film 14, the $Al_2O_3$ film 13, the Ti film 8b, the silicon oxide film 8a, and the silicon oxynitride film 7. Then, a Ti film and a TiN film are successively formed in the hole by sputtering, thereby forming a barrier-metal film (not shown). Then, a W film is deposited in the hole by CVD (Chemical Vapor Deposition) and is flattened by CMP, thereby forming a W plug 15.

Figure 2K:
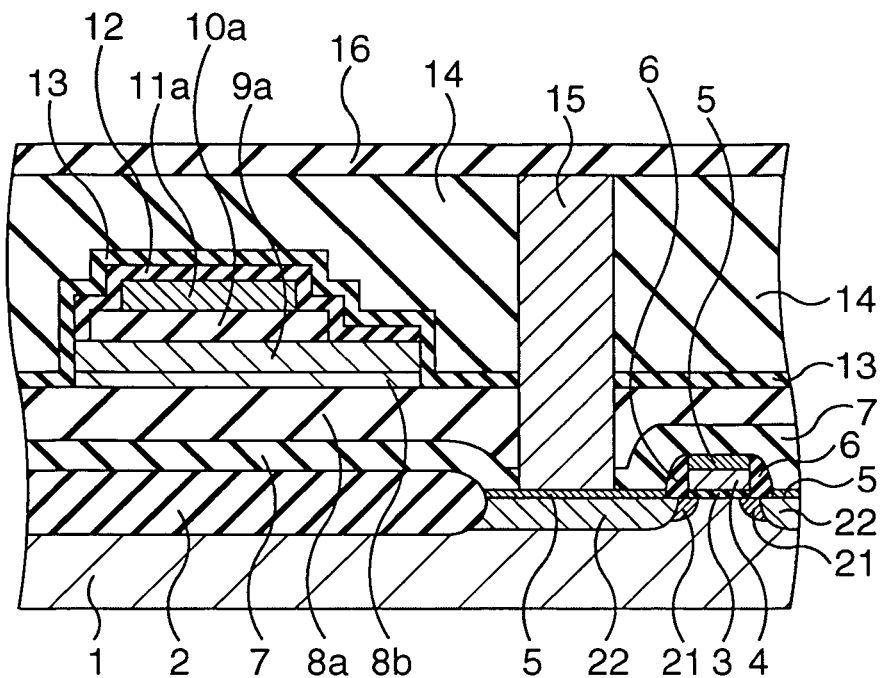

Next, a SiON film 16 serving as an anti-oxidation film of the W plug 15 is formed by plasma enhanced CVD, as shown in FIG. 2K.

Figure 2L:
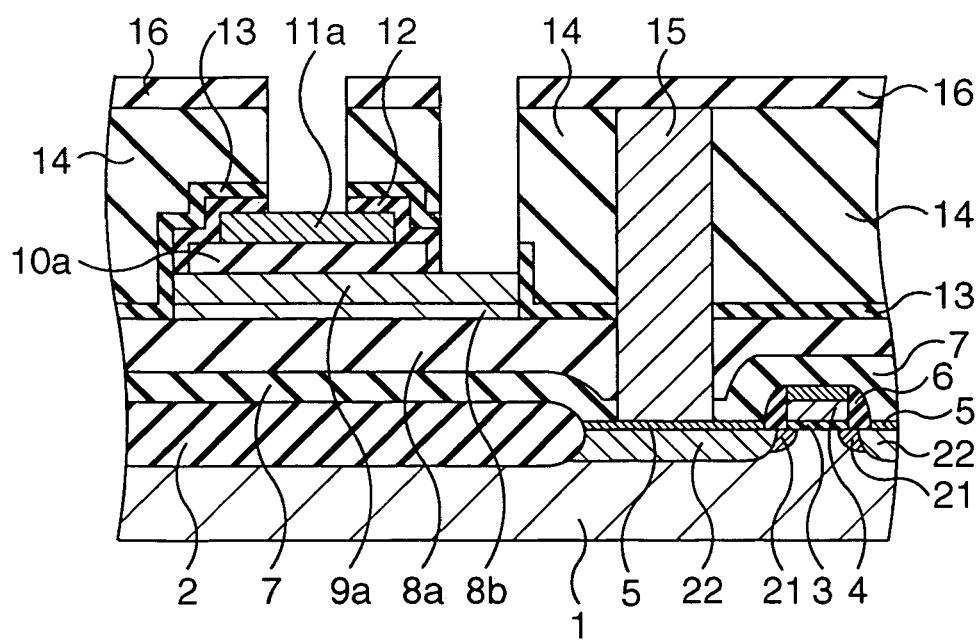

As shown in FIG. 2L, a hole reaching the top electrode 11a and a hole reaching the bottom electrode 9a are then formed in the SiON film 16, the interlayer insulation film 14, and the $Al_2O_3$ films 13 and 12. Then, oxygen annealing for recovering damage is performed.

Figure 2M:
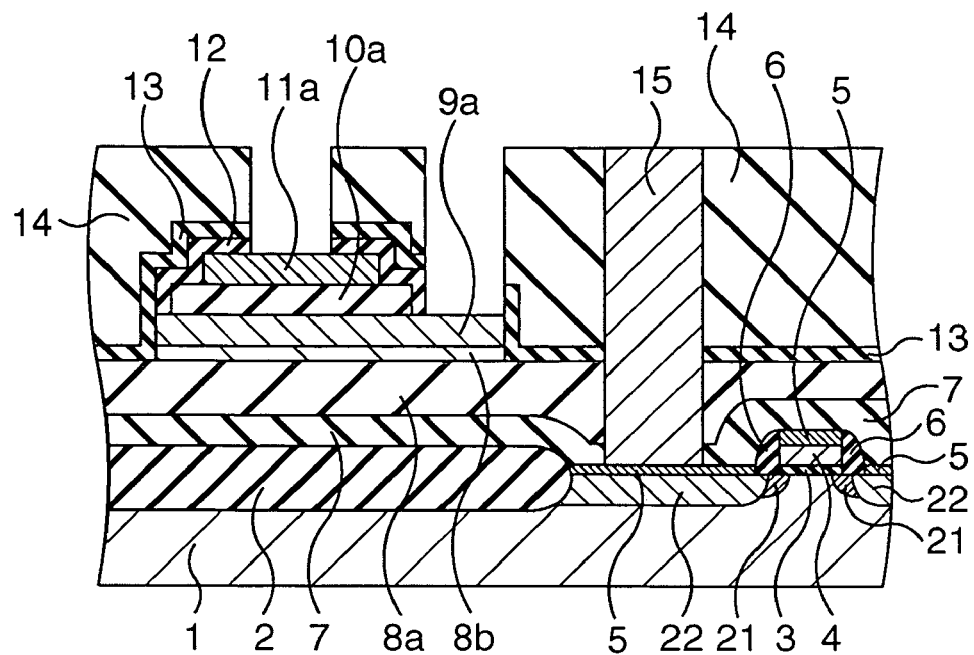
Figure 2N:
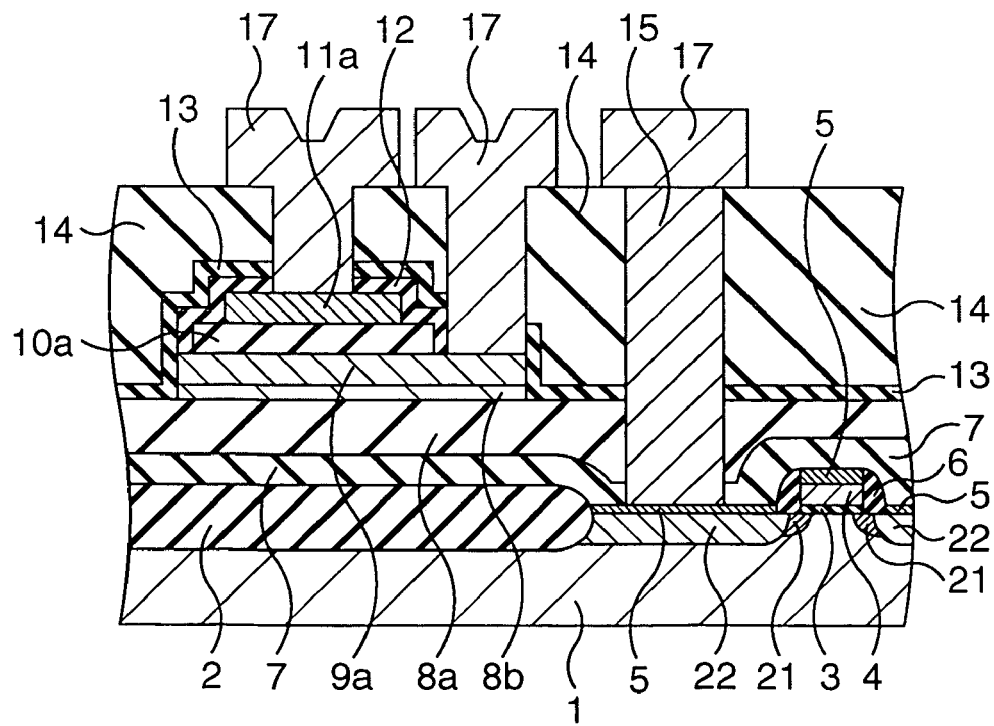

Subsequently, the SiON film 16 is etched back to be removed on the entire surface of the substrate 1, thereby exposing the surface of the W plug 15, as shown in FIG. 2M. Then, an Al film is formed in a state where a part of a surface of the top electrode 11a, a part of a surface of the bottom electrode 9a, and the surface of the W plug 15 are exposed, and thereafter the Al film is patterned to form an Al wiring 17, as shown in FIG. 2N. In this process, the W plug 15 and the top electrode 11a or the bottom electrode 9a are connected to each other by a part of the Al wiring 17, for example.

Then, an interlayer insulation film, a contact plug, and wirings at the second lowest level and higher levels are further formed. A cover film of TEOS oxide and SiN, for example, is then formed. In this manner, a ferroelectric memory having a ferroelectric capacitor is completed.

In the present embodiment, the flow rate of $O_2$ gas in the annealing for crystallization is appropriately defined, as described above. Thus, orientation of the ferroelectric film 10 can be made fairly favorable. For example, FWHM of a (111) plane of the ferroelectric film 10 can be made to be 4.6 degrees or less. Therefore, even if the ferroelectric film 10 is formed to have a thickness of 150 nm or less, it is possible to sufficiently bring out its characteristics. Please note that $O_3$ gas or $N_2O$ gas may be used as the oxidizing gas, other than $O_2$ gas. Moreover, $N_2$ gas or He gas may be used as the inert gas, other than Ar gas.

Moreover, it is preferable that the first annealing for crystallization be performed at a temperature of 550° C. or higher, for example, at a temperature range of from 580° C. to 650° C. It is preferable that the second annealing for crystallization be performed at a temperature of 650° C. or higher, for example, at a temperature range of from 725° C. to 775° C. In addition, it is preferable that the second annealing be performed in an atmosphere in which oxygen concentration is 50% or more.

Alternatively, a conductive film 18 such as an iridium oxide film may be formed on the top electrode film 11 after formation of the top electrode film 11, as shown in FIG. 3I. This conductive film 18 can be patterned at the same time as patterning of the top electrode film 11. In this case, it is preferable that the thickness of the ferroelectric film 10 be set to 150 nm or less, and it is also preferable that annealing for crystallization between formation of the ferroelectric film 10 and formation of the top electrode film 11 be performed under a condition in which the flow rate of the oxidizing gas such as $O_2$ gas is lower than 50 sccm and the flow rate of the inert gas such as Ar gas is 1500 sccm or more. Under an exemplary condition for annealing for crystallization, the temperature is in a range of from 540° C. to 620° C. (especially, 585° C.), the flow rate of $O_2$ gas is in a range of from 10 sccm to 50 sccm, and the flow rate of Ar gas is 1500 sccm or more. Moreover, the thickness of the top electrode film 11 is set to 100 nm or less, for example. Furthermore, it is preferable to perform a heat treatment in an oxidizing atmosphere (e.g., a mixed atmosphere of oxidizing gas such as $O_2$ gas and inert gas such as Ar gas) between formation of the top electrode film 11 and formation of the conductive film 18. This heat treatment is performed under a condition where a temperature is 650° C. or higher (preferably, in a range of from 700° C. to 750° C.) and a flow rate of $O_2$ gas is set from 10 sccm or more, for example. By performing such a treatment, a rocking curve full width at half maximum (FWHM) of a primary crystal plane of the ferroelectric film 10 can be made equal to or less than 4.6 degrees, for example. As the top electrode film 11, one or more films of metal or a metal oxide conductive material that contain platinum (Pt), iridium (Ir), ruthenium (Ru), rhodium (Rh) and/or $SrRuO_3$.

Next, results of experiments made by the inventor of the present application are described.

(First Experiment)

In the first experiment, a bottom electrode film was formed in two different ways following the above embodiment. Then, formation of a ferroelectric film (a PLZT film) and annealing for crystallization were performed. In both of the two ways, the flow rate of $O_2$ gas in the first RTA for crystallizing the ferroelectric film (PLZT) was changed. A total flow rate of the $O_2$ gas and Ar gas was fixed to 2000 sccm. After formation of the PLZT film, a rocking curve full width at half maximum (FWHM) of a (111) plane of the PLZT film and the peak intensity of a (101) plane were measured. The (111) plane is an orientation plane that can be switched. On the other hand, the (101) plane can be switched but has low intensity. FWHM of the (111) plane was obtained by four-axis X-ray diffraction. The peak intensity of the (101) plane was obtained by three-axis X-ray diffraction. The measurement results are shown in FIGS. 3 and 4, respectively. In FIGS. 3 and 4, the symbol ♦ represents the results in the case where the bottom electrode film was formed at a high temperature, and the symbol ■ represents the results in the case where the bottom electrode film was formed at a low temperature.

As shown in FIG. 3, when the flow rate of $O_2$ gas was reduced, FWHM became smaller and the crystallinity was improved. Especially, when the flow rate of $O_2$ gas was 75 sccm or lower, FWHM was small. Moreover, as shown in FIG. 4, almost no orientation along the (101) plane of the PLZT film was detected when the flow rate of $O_2$ gas was in a range of from 25 sccm to 75 sccm. when the flow rate Of $O_2$ gas was 15 sccm or less, some of the PLZT film was oriented along the (101) plane. It is considered that this was caused by occurrence of oxygen deficiency. Considering the above results, it is preferable that the flow rate of $O_2$ gas be in a range of from 25 sccm to 75 sccm.

(Second Experiment)

In the second experiment, the annealing process for crystallizing the ferroelectric film and the processes before that process were performed in a similar manner to that in the first experiment, and thereafter the top electrode film was formed. Then, a ferroelectric capacitor (discrete) was formed. A planar shape of this ferroelectric capacitor was a square having a 50-μm long side. After formation of the ferroelectric capacitor, an average switching charge amount $Q_{SW}$ when a pulse voltage having a pulse width of 1 μsec was applied was measured. The switching charge amount $Q_{SW}$ was a value obtained by the Expression 1. The measurement result is shown in FIG. 5.

Figure 5:
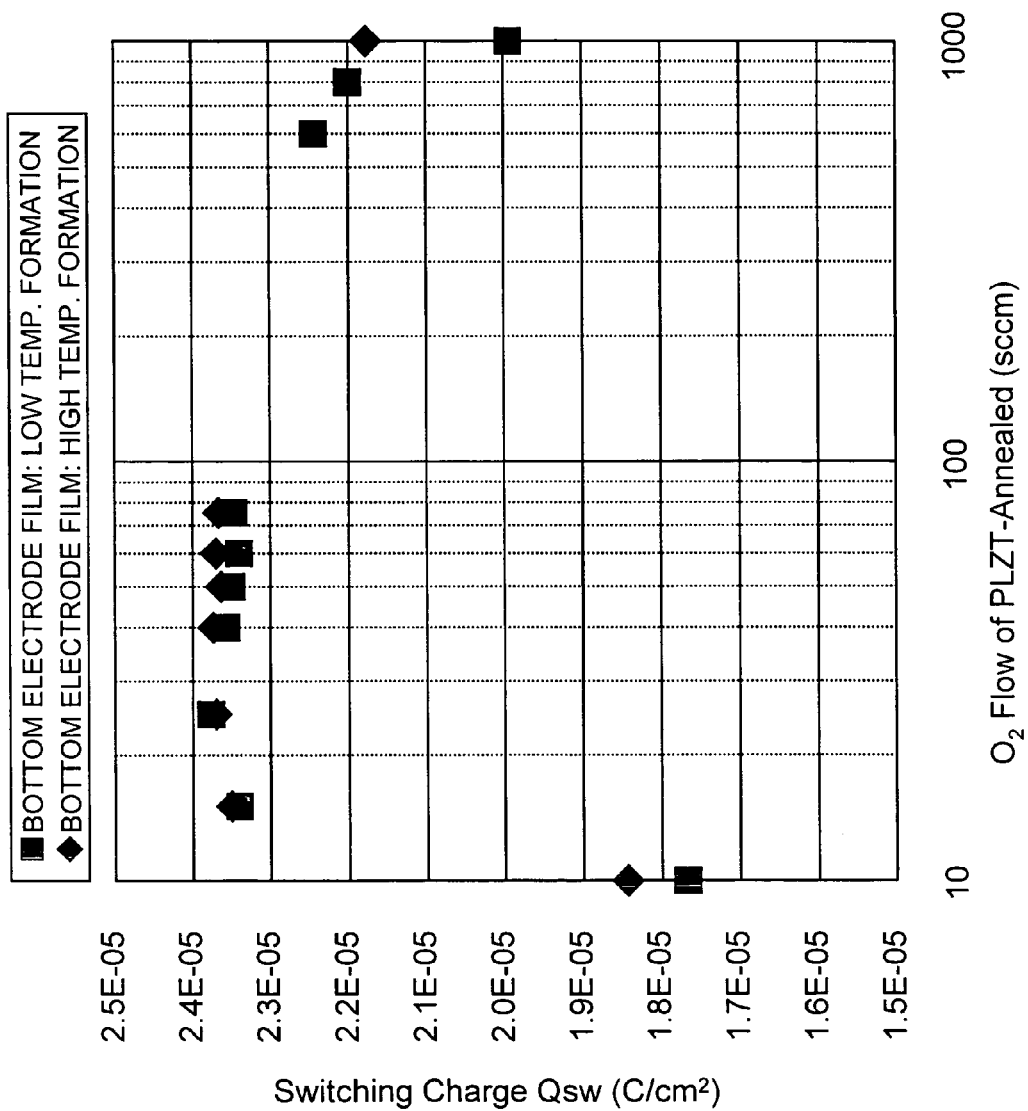
FIG. 5 is a graph showing an average switching charge amount.

As shown in FIG. 5, when the flow rate of $O_2$ gas exceeded 100 sccm, orientation along the (101) plane of the PLZT film was reduced and the switching charge amount $Q_{SW}$ was small. Moreover, when the flow rate of $O_2$ gas was 15 sccm or less, the switching charge amount $Q_{SW}$ was also small. In general, when the PLZT film is highly oriented along a (111) plane, crystal grains are columnar from a top surface to a bottom and the switching charge amount $Q_{SW}$ is large. On the other hand, in the case where the flow rate of $O_2$ gas is 15 sccm or less, there are large crystal grains due to oxygen deficiency, in addition to the columnar crystals. Those large crystal grains are oriented at random. Thus, a region in which those large crystal grains exist does not contribute to polarization inversion easily. For this reason, the switching charge amount $Q_{SW}$ cannot be large.

(Third Experiment)

Figure 6:
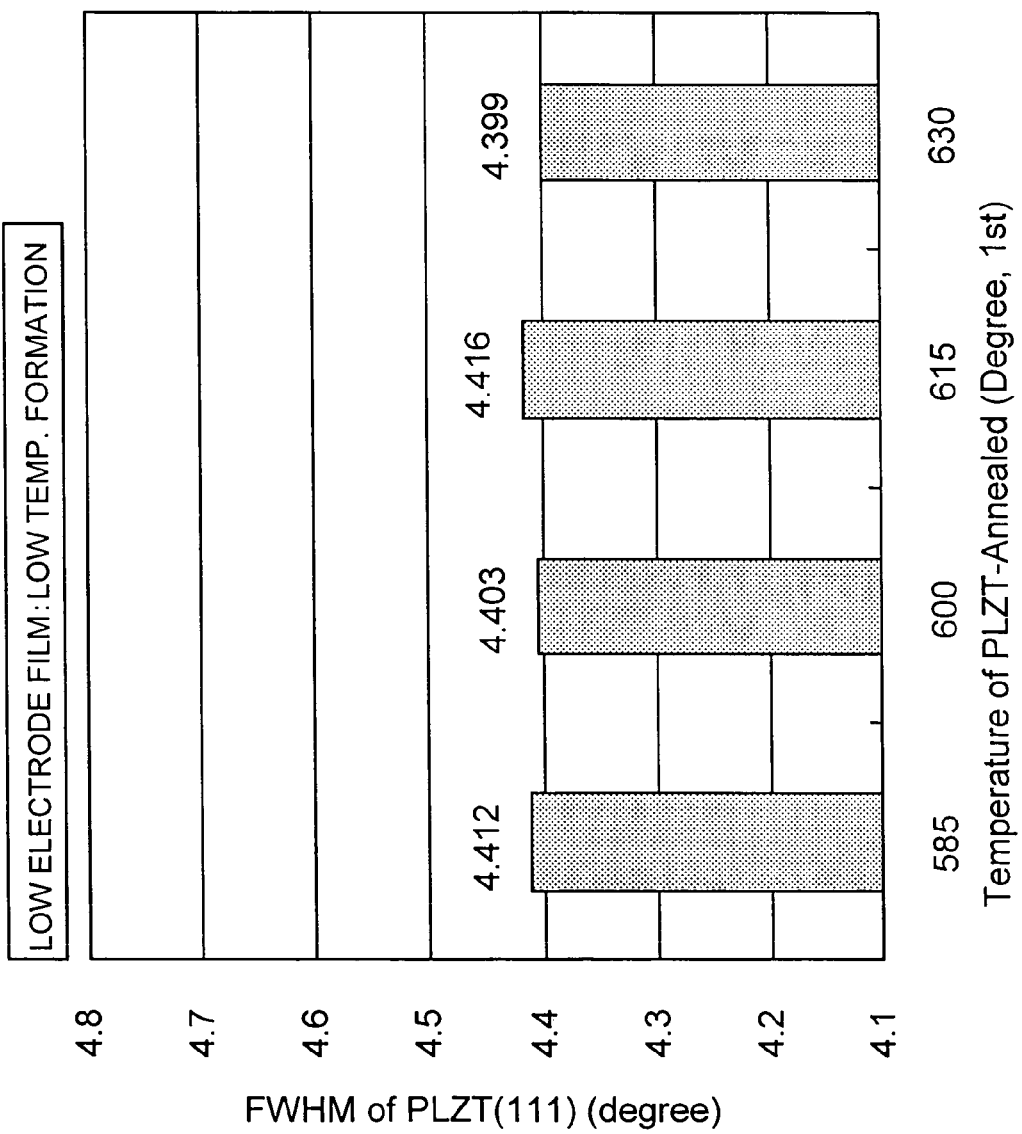
FIG. 6 is a graph showing a rocking curve full width at half maximum (FWHM) of a (111) plane.

In the third experiment, a ferroelectric film was formed in four different ways following the embodiment and orientation of the ferroelectric film was examined. In those four ways, the temperature in the first RTA for crystallizing a ferroelectric film (a PLZT film) was changed. A bottom electrode film was formed under the low-temperature condition (■) in the first experiment. The first RTA for crystallization was performed under a condition where the flow rate of $O_2$ gas was 50 sccm, the flow rate of Ar gas was 1950 sccm, the temperature was set to 585° C., 600° C., 615° C., or 630° C., and the duration was 90 seconds. The second RTA was performed in an oxygen atmosphere at 750° C. for 60 seconds. FWHM of a (111) plane of the PLZT film was obtained by four-axis X-ray diffraction. FIG. 6 shows the results of this experiment.

As shown in FIG. 6, good results were obtained for all RTA temperatures. Moreover, when the switching charge amount $Q_{SW}$ was measured after formation of a ferroelectric capacitor (discrete), results similar to those shown in FIG. 5 were obtained, although the results are not shown in the drawing. Furthermore, orientation of the PLZT film along the (111) plane and the switching charge amount $Q_{SW}$ changed little, even when the temperature of the second RTA was changed. From those results, it is considered that the orientation of the PLZT film along the (111) plane is largely affected by the first RTA.

(Fourth Experiment)

In the fourth experiment, three ferroelectric films that were different in the thickness were formed in accordance with the embodiment. Please note that a different bottom electrode film from those formed in the first to third experiments was formed. When orientation of a bottom electrode film (Pt film) along a (111) plane was measured by four-axis X-ray diffraction, FWHM of about 3.0 degrees was obtained. After formation of the ferroelectric film, RTA was performed in an atmosphere of Ar and $O_2$ at a temperature of 600° C. or lower. An $IrO_x$ film having a thickness of 50 nm was then formed as a top electrode film. Subsequently, RTA was performed for the top electrode film and the PLZT film in an atmosphere of Ar and $O_2$ ($O_2$ concentration: 0.1 to 100%, no limitation) at a temperature of 700° C. or higher.

Figure 7:
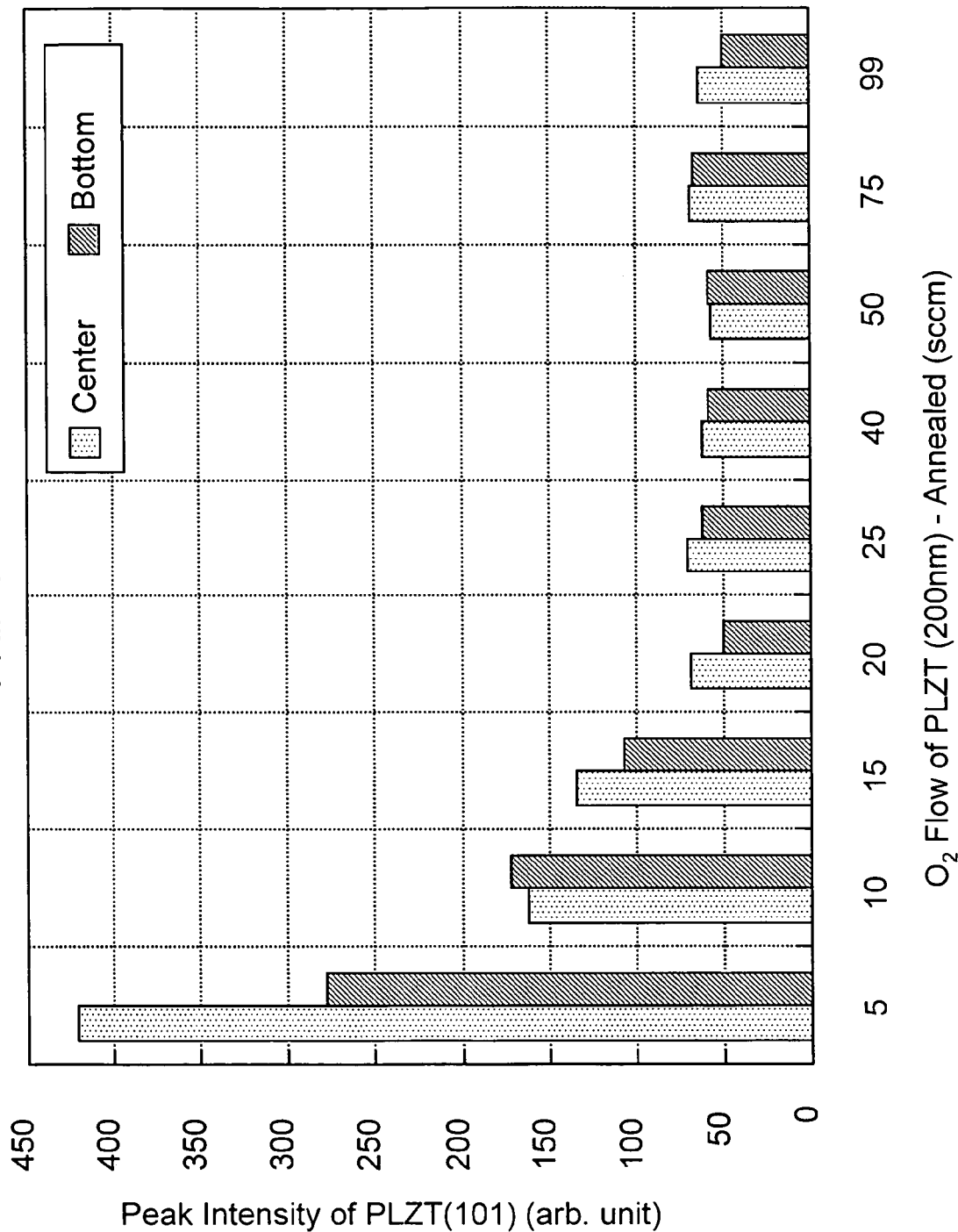
FIG. 7 is a graph showing a peak intensity of a (101) plane in the case where the thickness of a PLZT film is 200 nm.
Figure 8:
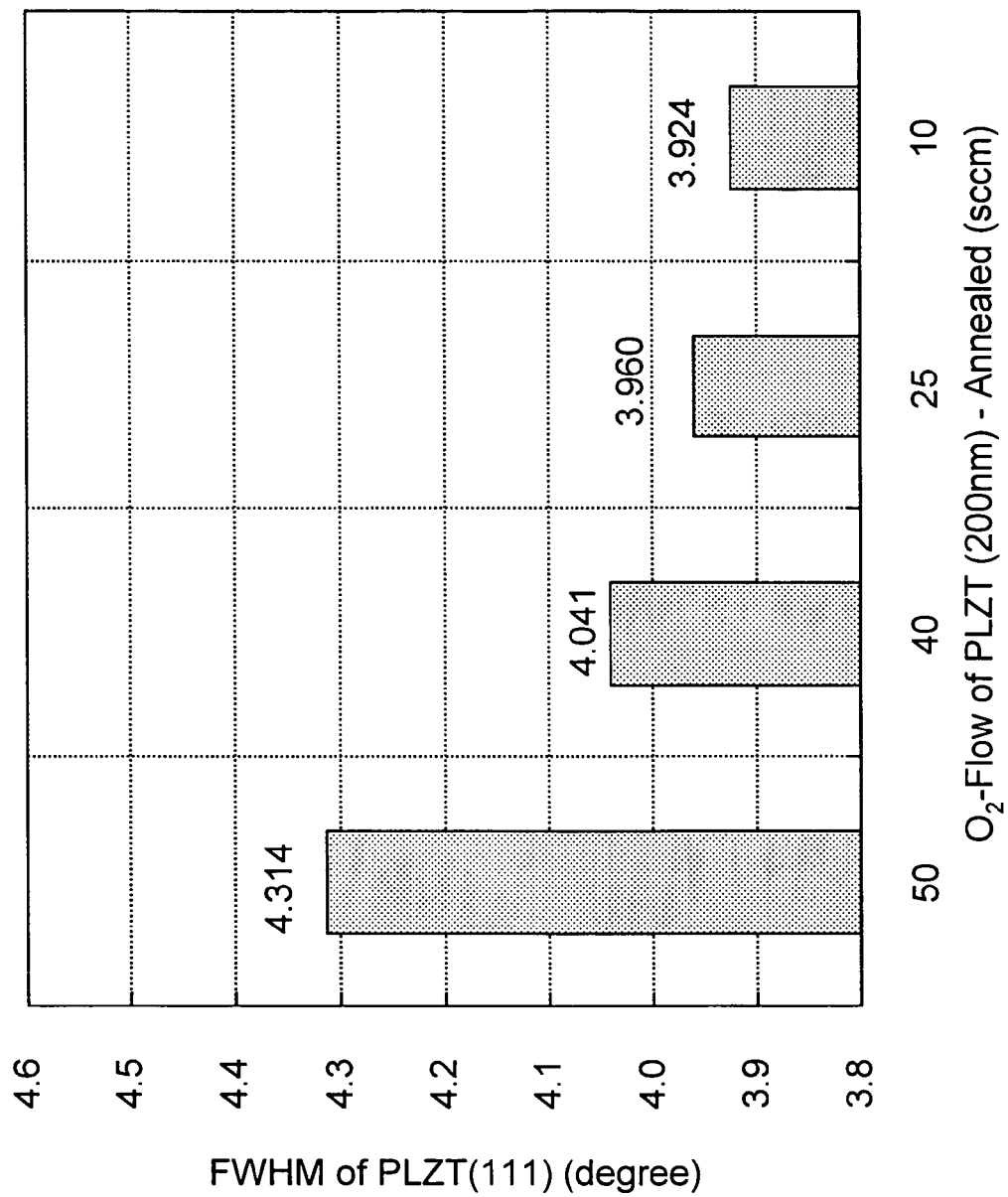
FIG. 8 is a graph showing a rocking curve full width at half maximum (FWHM) of a (111) plane in the case where the thickness of the PLZT film is 200 nm.
Figure 9:
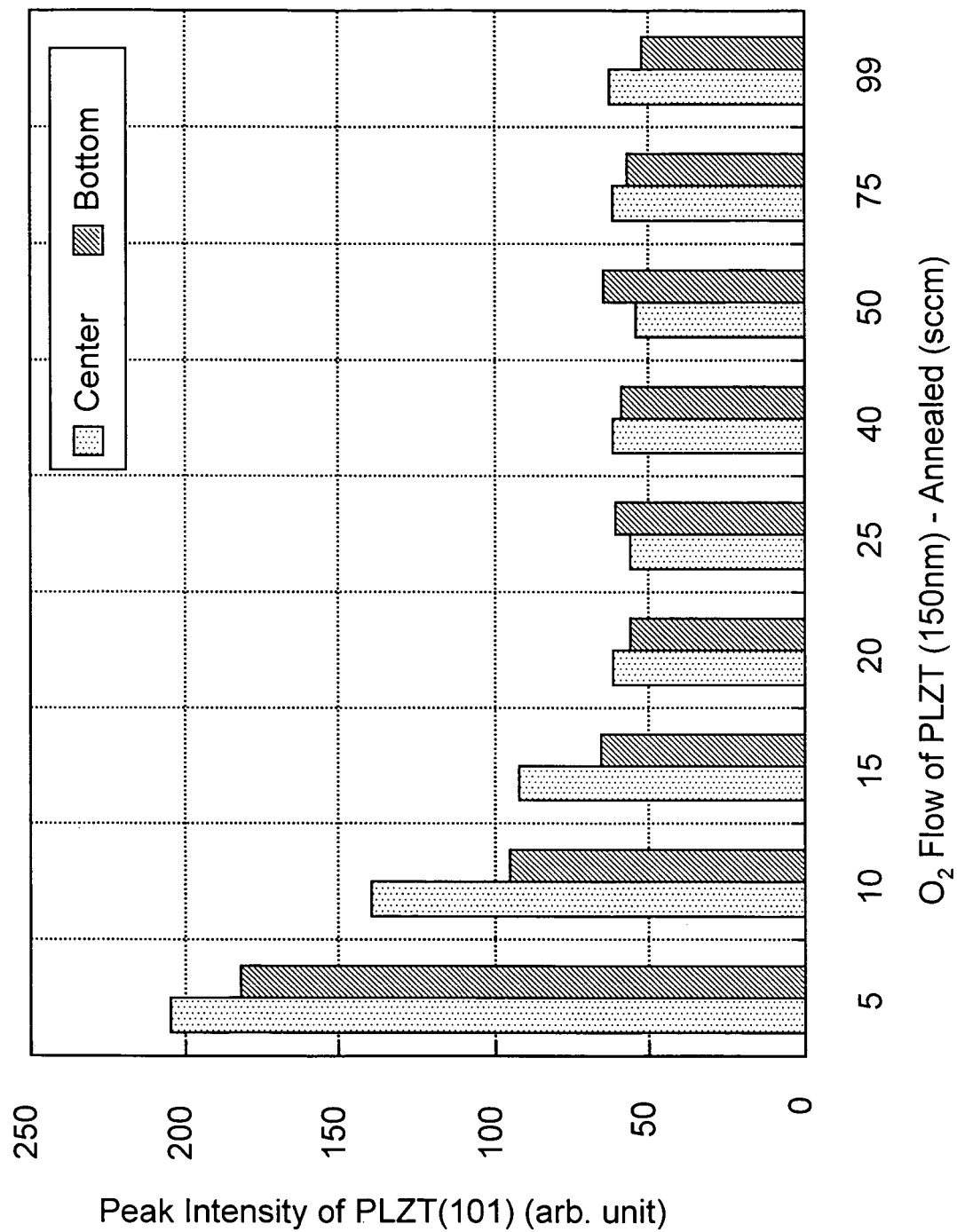
FIG. 9 is a graph showing a peak intensity of a (101) plane in the case where the thickness of a PLZT film is 150 nm.
Figure 10:
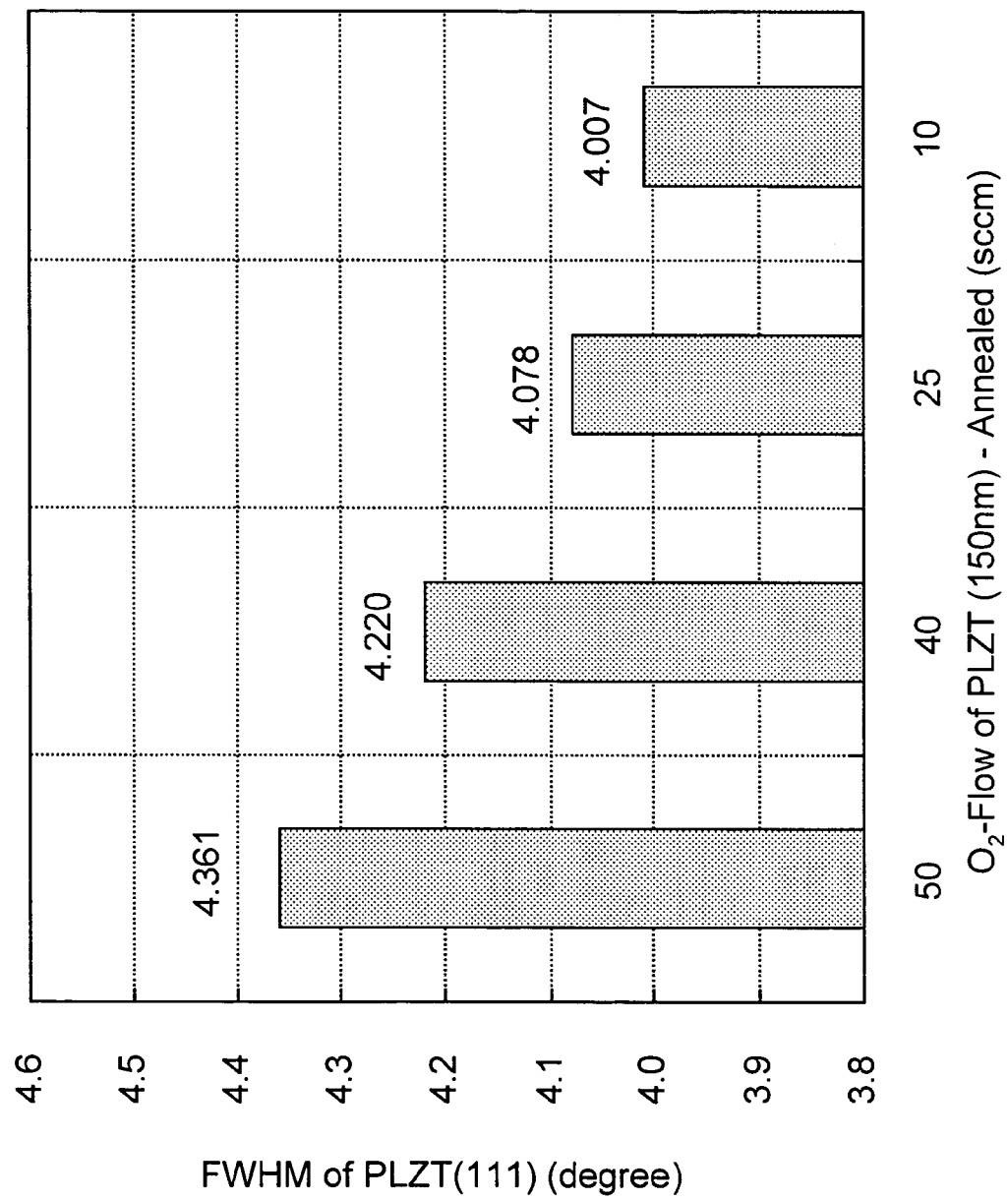
FIG. 10 is a graph showing a rocking curve full width at half maximum (FWHM) of a (111) plane in the case where the thickness of a PLZT film is 150 nm.
Figure 11:
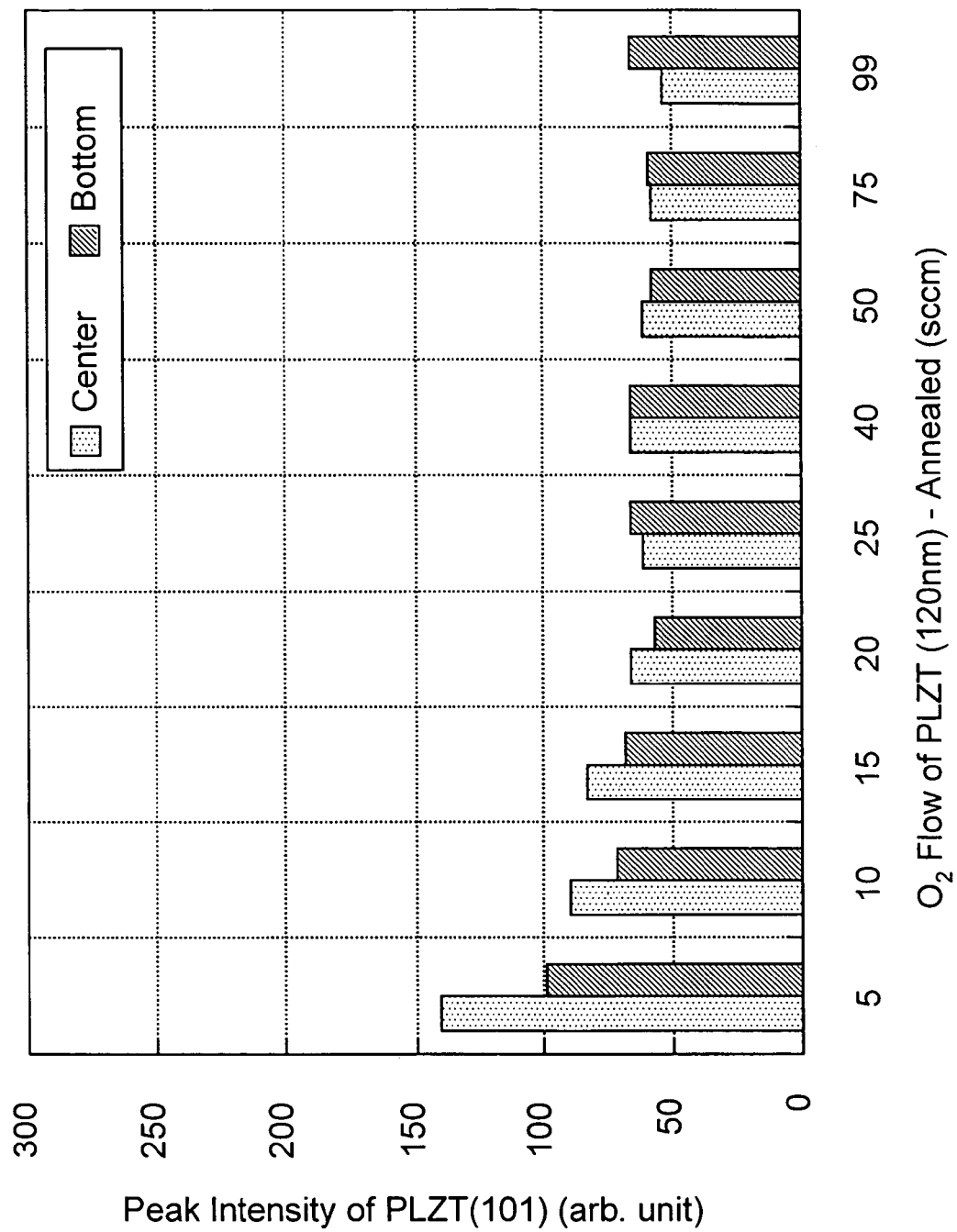
FIG. 11 is a graph showing a peak intensity of a (101) plane in the case where the thickness of a PLZT film is 120 nm.
Figure 12:
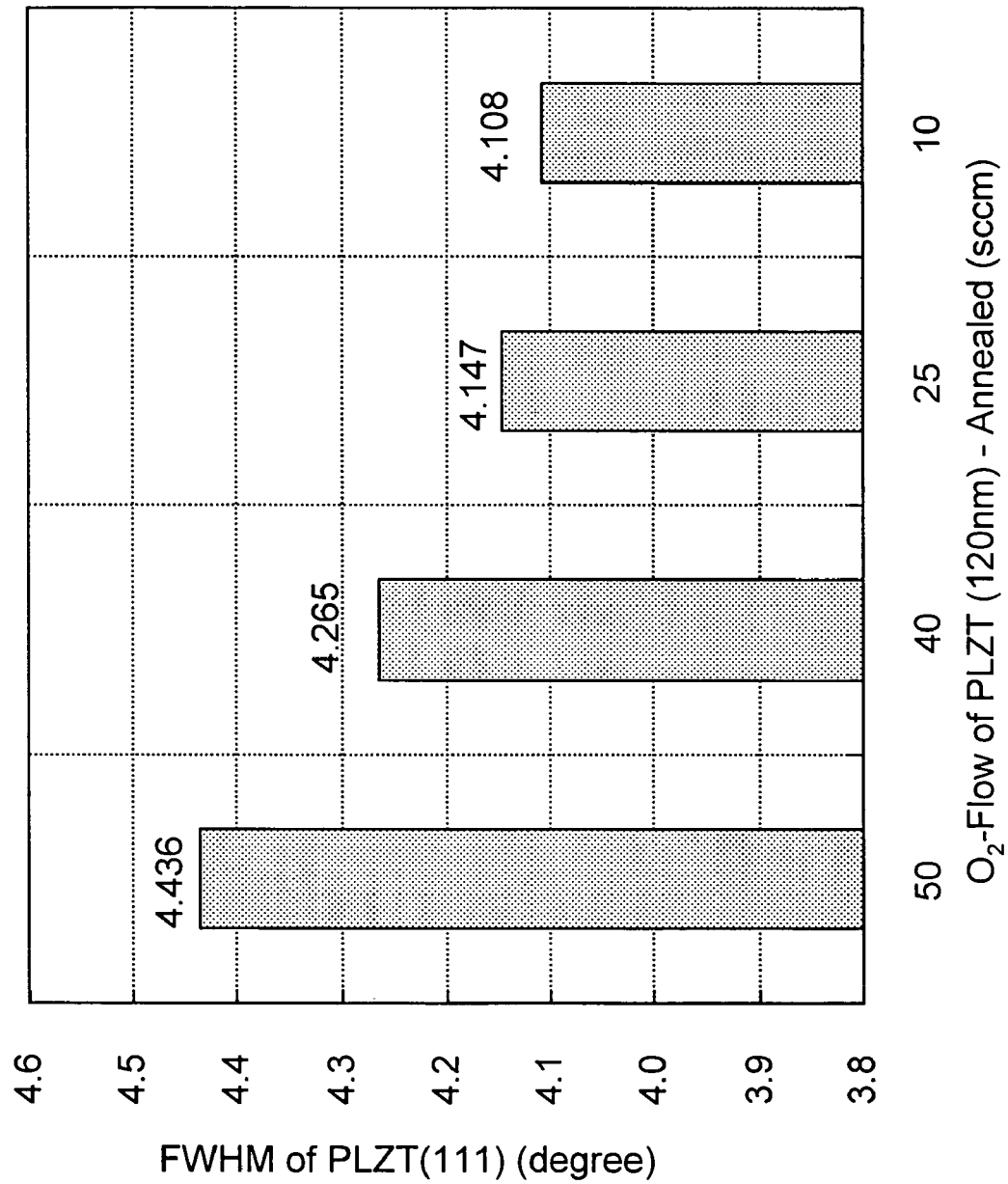
FIG. 12 is a graph showing a rocking curve full width at half maximum (FWHM) of a (111) plane in the case where the thickness of a PLZT film is 120 nm.

As a result of this RTA, the PLZT film was completely crystallized and the interface between the ferroelectric film and the top electrode film was improved. Moreover, the bottom electrode film (Pt film) was made dense and mutual diffusion of Pt and O around a boundary between the bottom electrode and the PLZT film was suppressed. Similarly to the first experiment, FWHM of a (111) plane of the PLZT film and the peak intensity of a (101) plane were measured. Those results were shown in FIGS. 7 to 12. FIGS. 7 and 8 show the peak intensity of the (101) plane and FWHM of the (111) plane, respectively, in the case where the PLZT film has a thickness of 200 nm. FIGS. 9 and 10 show the peak intensity of the (101) plane and FWHM of the (111) plane, respectively, in the case where the PLZT film has a thickness of 150 nm. FIGS. 11 and 12 show the peak intensity of the (101) plane and FWHM of the (111) plane, respectively, in the case where the PLZT film has a thickness of 120 nm. In FIGS. 7, 9 and 11, the term "center" represents the peak intensity at a center of a wafer and the term "bottom" represents that at a lower portion of the wafer (i.e., a portion on the side of the center where orientation flat is provided).

As shown in FIG. 7, in the case where the thickness of the PLZT film was 200 nm, almost no orientation of the PLZT film along the (101) plane was observed when the flow rate of $O_2$ gas was in a range of from 20 sccm to 100 sccm. On the other hand, when the flow rate of $O_2$ gas was 15 sccm or less, the PLZT film was slightly oriented along the (101) plane due to oxygen deficiency. Moreover, as shown in FIG. 8, as the flow rate of $O_2$ gas became smaller, FWHM became smaller. FWHM of 4.5 degrees or less, which was a good value, was obtained when the flow rate of $O_2$ gas was in a range of from 10 sccm to 50 sccm. Especially, when the flow rate of $O_2$ gas was about 25 sccm, FWHM of 4.0 degrees or less was obtained. Considering those results, it is preferable that the flow rate of $O_2$ gas be in a range of from 20 sccm to 50 sccm, in particular.

As shown in FIG. 9, in the case where the thickness of the PLZT film was 150 nm, almost no orientation along the (101) plane was observed when the flow rate of $O_2$ gas was in a range of from 15 sccm to 100 sccm. On the other hand, when the flow rate of $O_2$ gas was 10 sccm or less, the PLZT film was slightly oriented along the (101) plane due to oxygen deficiency. Moreover, as the flow rate of $O_2$ gas became smaller, FWHM became smaller, as shown in FIG. 10. FWHM of 4.5 degrees or less, which was a good value, was obtained when the flow rate of $O_2$ gas was in a range of from 10 sccm to 50 sccm. Especially, when the flow rate of $O_2$ gas was about 25 sccm, FWHM of 4.1 degrees or less was obtained. Considering those results, it is preferable that the flow rate of $O_2$ gas be in a range of from 15 sccm to 50 sccm, in particular.

As shown in FIG. 11, in the case where the thickness of the PLZT film was 120 nm, almost no orientation along the (101) plane was observed when the flow rate of $O_2$ gas was in a range of from 10 sccm to 100 sccm. On the other hand, when the flow rate of $O_2$ gas was 5 sccm or less, the PLZT film was slightly oriented along the (101) plane due to oxygen deficiency. Moreover, as the flow rate of $O_2$ gas became smaller, FWHM became smaller, as shown in FIG. 12. FWHM of 4.5 degrees or less, which was a good value, was obtained when the flow rate of $O_2$ gas was in a range of from 10 sccm to 50 sccm. Especially, when the flow rate of $O_2$ gas was about 25 sccm, FWHM of 4.2 degrees or less was obtained. Considering those results, it is preferable that the flow rate of $O_2$ gas be in a range of from 10 sccm to 50 sccm, in particular.

(Fifth Experiment)

In the fifth experiment, the annealing process (RTA) for crystallizing the ferroelectric film and the processes before that process were performed in a similar manner to that in the fourth experiment and thereafter an iridium oxide film (thickness: 200 nm) was formed on a top electrode film. The flow rate of $O_2$ gas in the first RTA was set to 25 sccm. Then, a square ferroelectric capacitor (discrete) having a 50-µm long side and 1428 rectangular ferroelectric capacitors (cell array) each having a 1.50-µm long side and a 1.15-µm short side were formed. Furthermore, three wiring layers were formed. Then, the switching charge amount, a leak current, and the like were measured.

Figure 13:
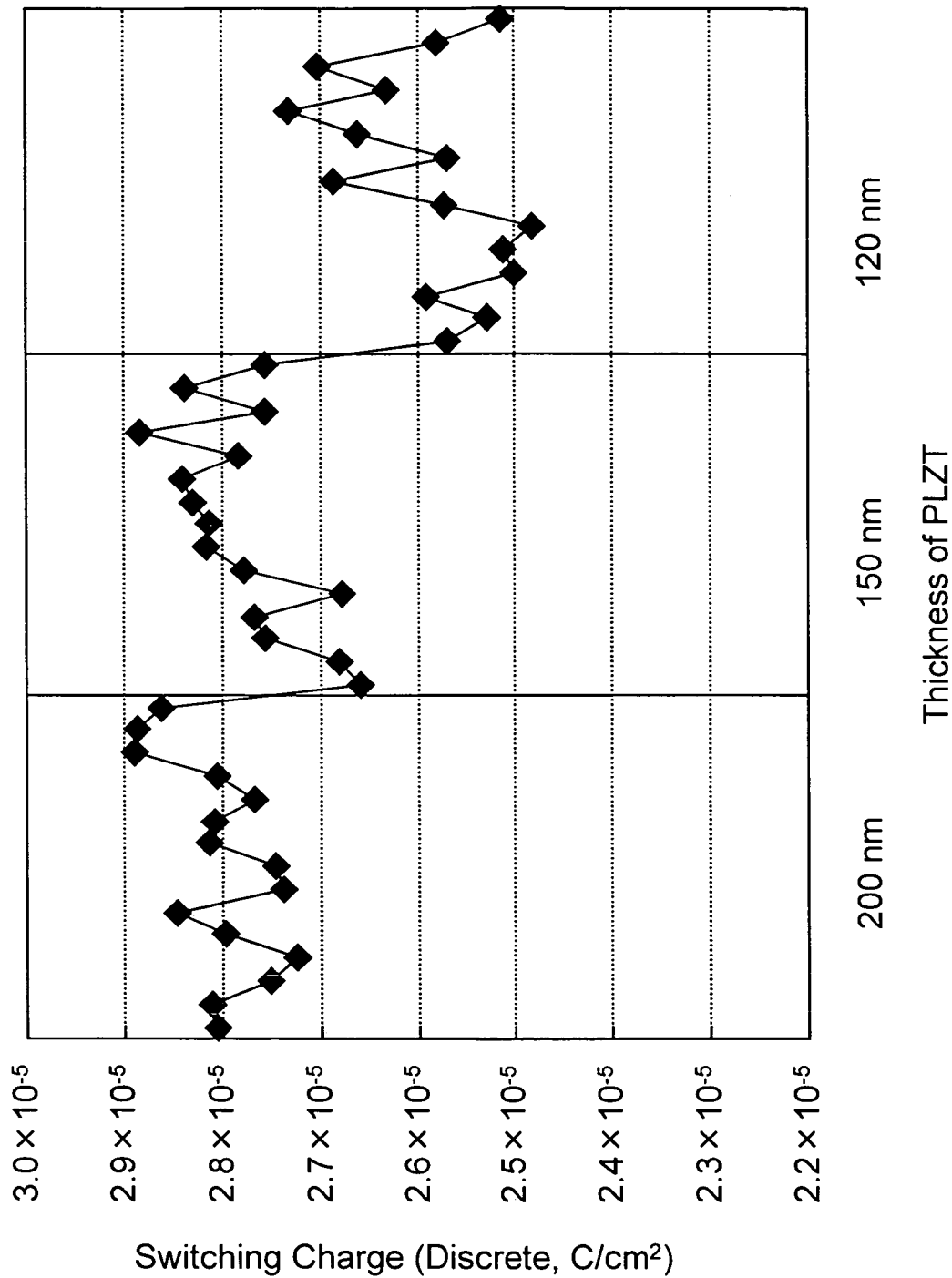
FIG. 13 is a graph showing the switching charge amount in a discrete ferroelectric capacitor.
Figure 14:
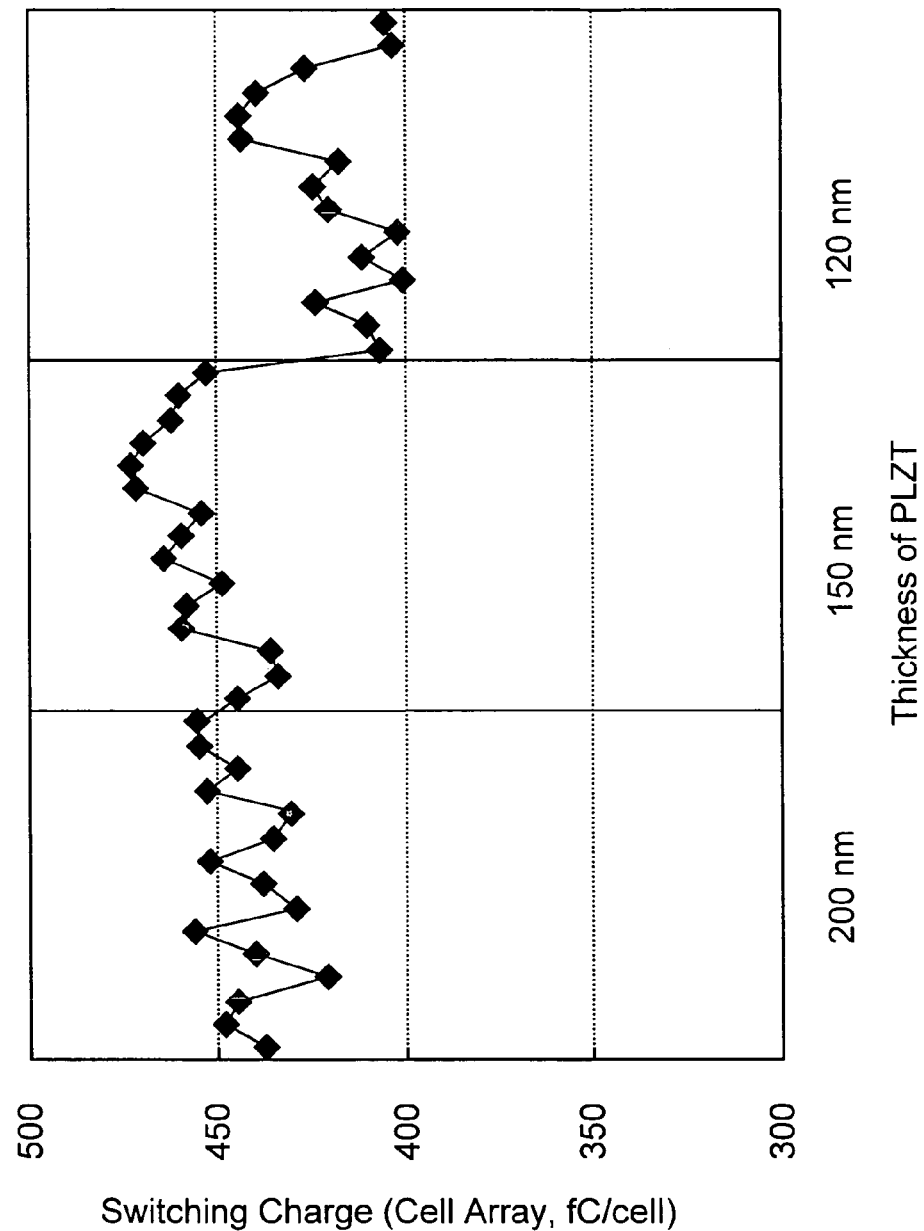
FIG. 14 is a graph showing the switching charge amount in a cell array.

FIGS. 13 and 14 are graphs showing the measurement results of the switching charge amount in the ferroelectric capacitor (discrete) and the ferroelectric capacitors (cell array), respectively. In the measurement of the switching charge amount, an applied voltage was set to 3 V and a pulse width was set to 1 µsec. As shown in FIGS. 13 and 14, when the thickness of the PLZT film was 200 nm and 150 nm, the switching charge amount was not largely different. On the other hand, when the thickness of the PLZT film was 120 nm, the switching charge amount was slightly reduced.

Figure 15:
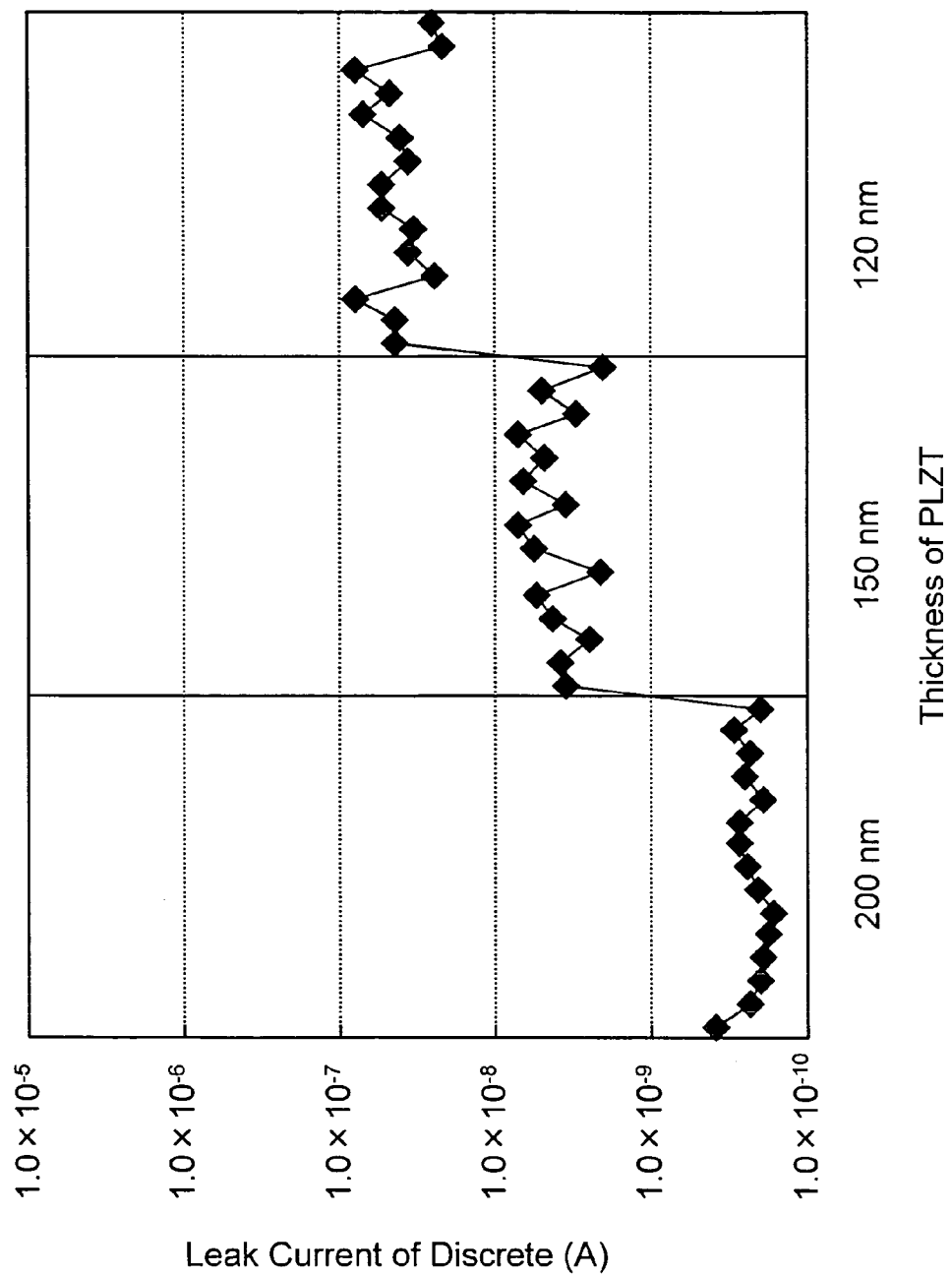
FIG. 15 is a graph showing a leak current in a discrete ferroelectric capacitor.
Figure 16:
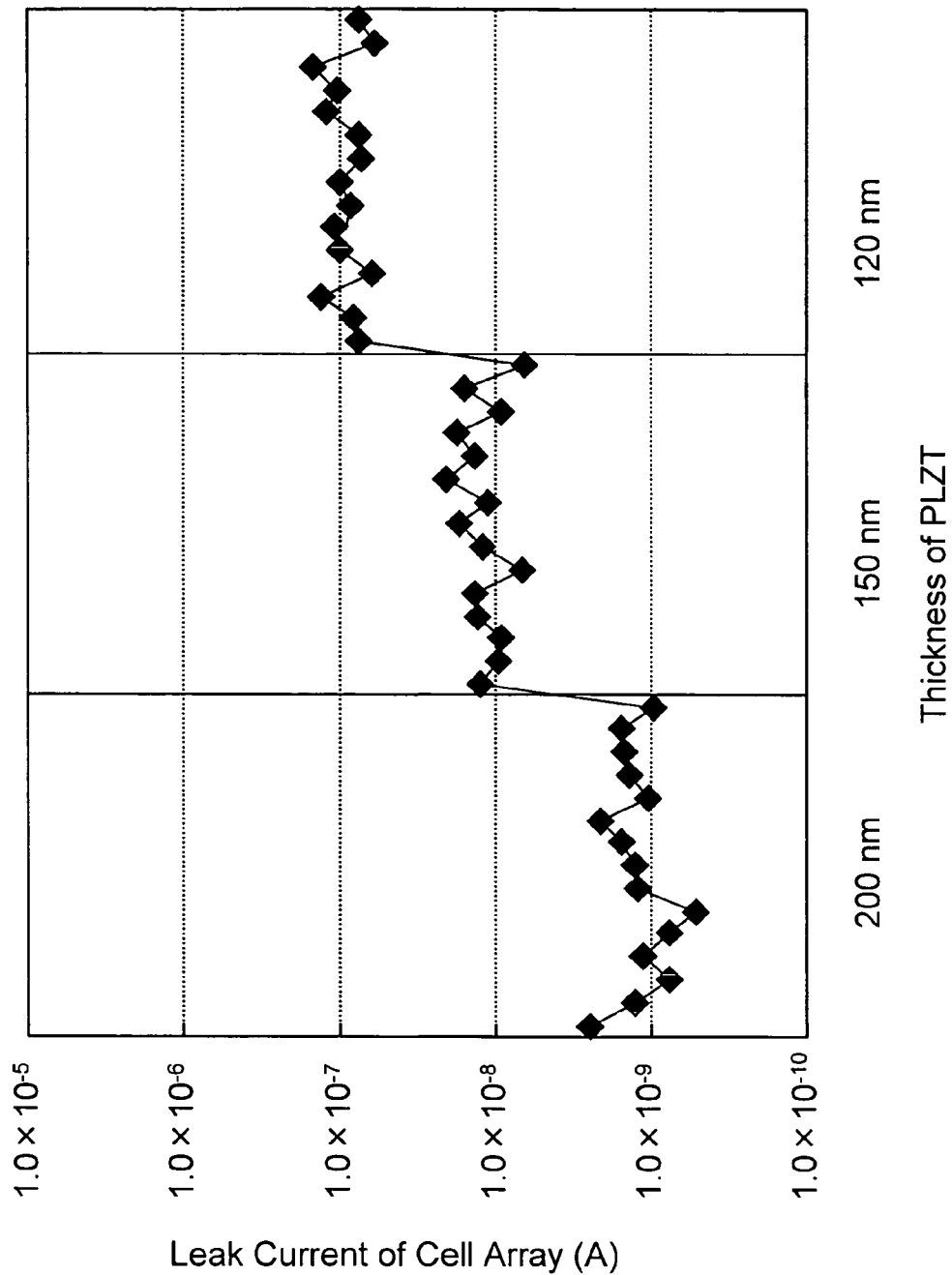
FIG. 16 is a graph showing a leak current in a cell array.

FIGS. 15 and 16 are graphs showing the measurement results of the leak current in the ferroelectric capacitor (discrete) and the ferroelectric capacitors (cell array), respectively. In the measurement of the leak current, an applied voltage was set to 5 V. As shown in FIGS. 15 and 16, the leak current increased as the PLZT film became thinner. However, the increase of the leak current did not matter.

Figure 17:
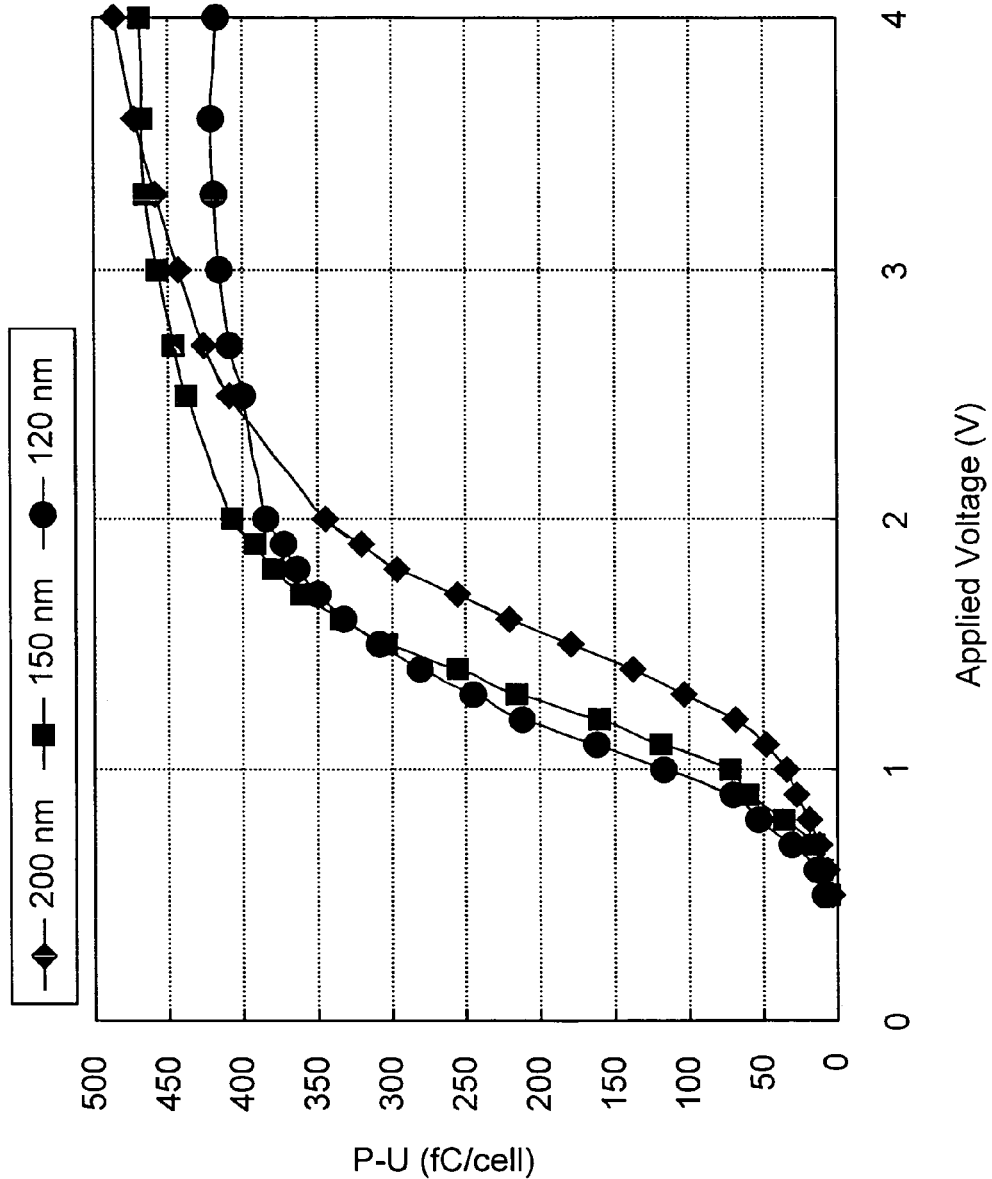
FIG. 17 is a graph showing Value P-U.

FIG. 17 is a graph showing the measurement result of "P-U (see FIG. 35)" in the ferroelectric capacitor (1T1C type cell array). As shown in FIG. 17, as the PLZT film became thinner, an electric field acting on the ferroelectric capacitor at the same applied voltage became larger. Therefore, rising of the switching charge amount became quicker. This is preferable especially for a low voltage operation.

Figure 18:
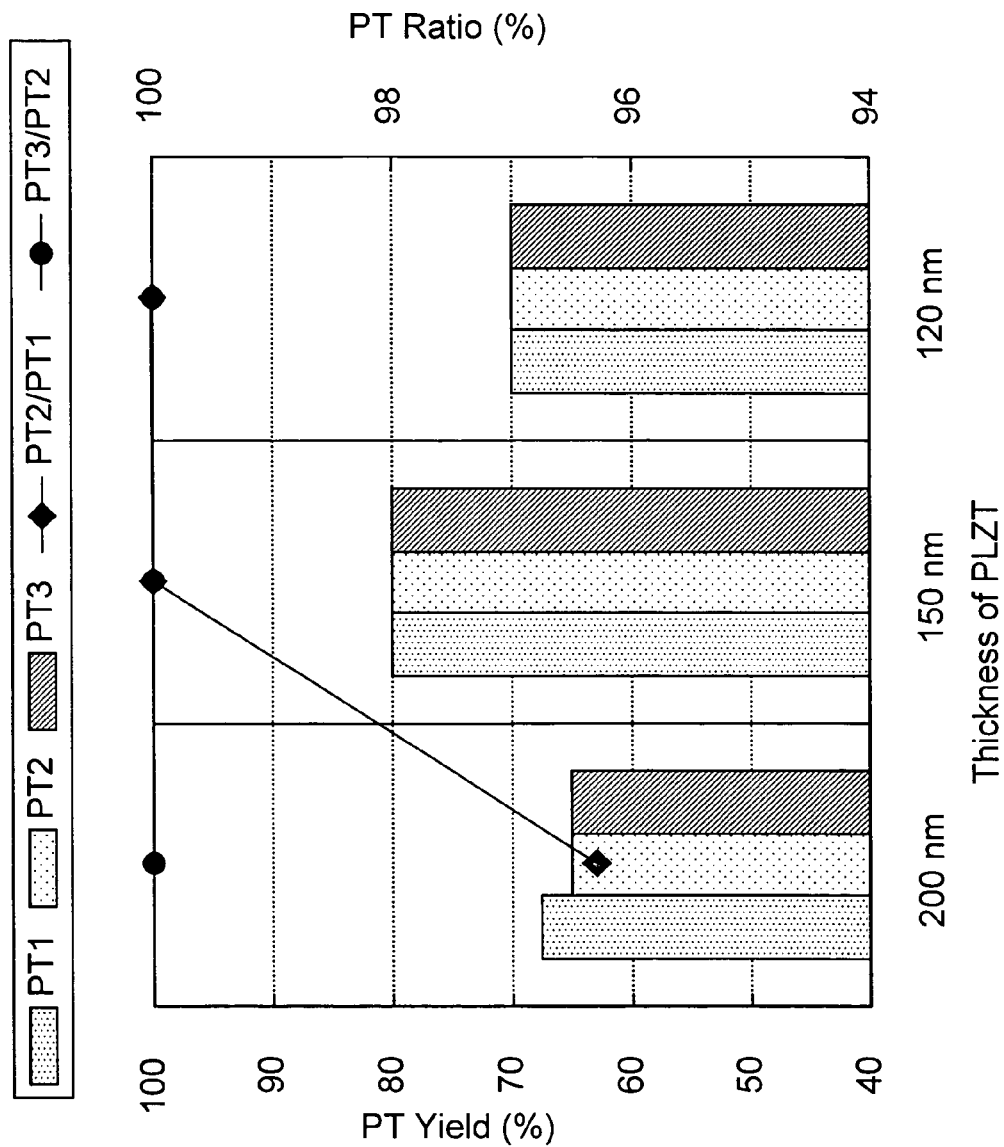
FIG. 18 is a graph showing a yield.

FIG. 18 is a graph showing the measurement result of an yield in the ferroelectric capacitor (1T1C type cell array). In the yield measurement, an operating voltage was set to 3 V. Bar graphs in FIG. 18 represent PT yields (PT1, PT2, and PT3). PT1 represents an yield in the case where writing and reading were performed in that order, PT2 represents an yield in the case where a heat treatment was performed at 250° C. before reading, and PT3 represents an yield in the case where data was inversed after the heat treatment described for PT2. A line plot in FIG. 18 represents a PT ratio, in which the symbol ♦ represents a value of "PT2/PT1" and the symbol ● represents a value of "PT3/PT2." Under all the conditions, good yields were obtained.

(Sixth Experiment)

Figure 19:
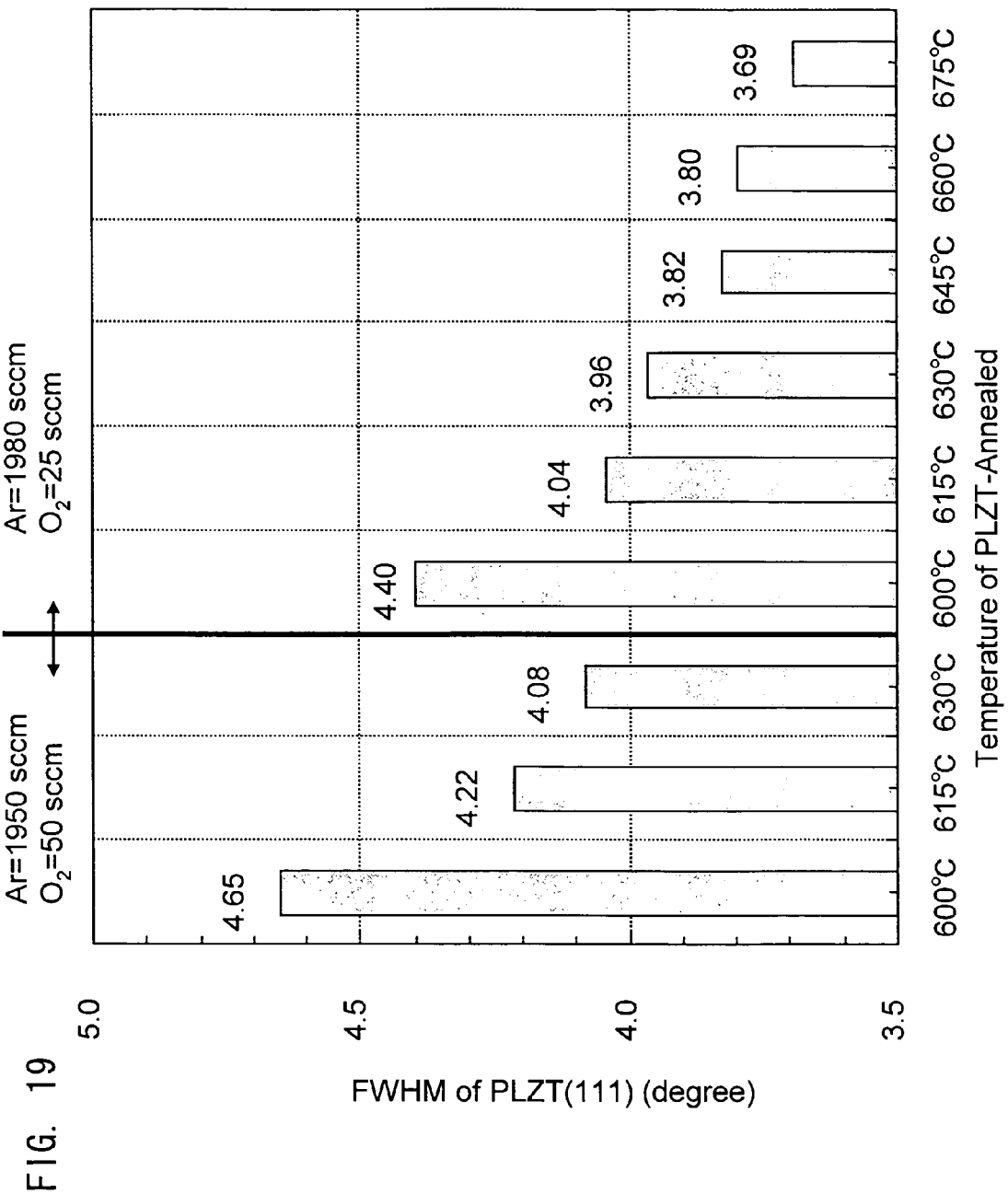
FIG. 19 is a graph showing a rocking curve full width at half maximum (FWHM) of a (111) plane.
Figure 20:
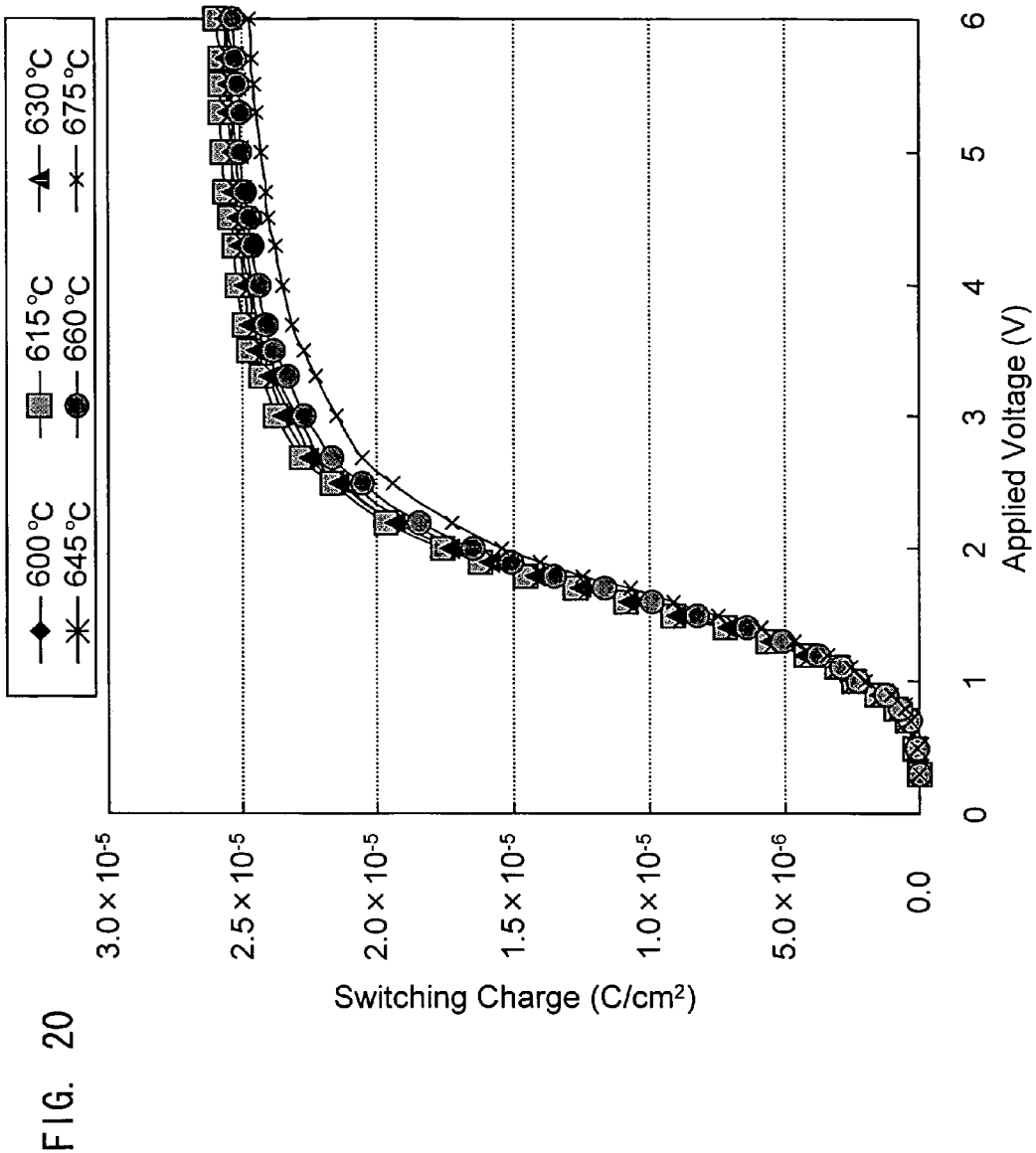
FIG. 20 is a graph showing a relationship between an applied voltage and the switching showing charge amount in a discrete ferroelectric capacitor.

In the sixth experiment, a ferroelectric film (thickness: 150 nm) was formed in accordance with the embodiment in various ways and orientation of the ferroelectric film was observed. In those ways, a condition for the first RTA performed for crystallizing the ferroelectric film (PLZT) was changed. A bottom electrode film was formed under the high-temperature condition (♦) in the first experiment. The first RTA for crystallization was performed for 90 seconds at various flow rates of $O_2$ gas and Ar gas and various temperatures. The second RTA was performed in an oxygen atmosphere at 750° C. Then, FWHM of a (111) plane of the PLZT film was obtained by four-axis X-ray diffraction. The measurement result is shown in FIG. 19. Moreover, a relationship between an applied voltage and the switching charge amount in the ferroelectric capacitor (discrete) is shown in FIG. 20. In the measurement for obtaining the result shown in FIG. 20, the flow rates of O₂ gas and Ar gas in the first RTA were set to 25 sccm and 1980 sccm, respectively.

As shown in FIG. 19, as the flow rate of O₂ gas was lower, FWHM was smaller. Moreover, as the temperature in the first RTA was higher, FWHM was smaller and the crystallinity of the PLZT film was improved. It is considered that FWHM of 4.3 degrees or less can be obtained by setting the flow rate of O₂ gas to 50 sccm and setting the annealing temperature to 615° C. or higher. In addition, as shown in FIG. 20, when the annealing temperature became higher, the crystallinity of the PLZT film was improved. However, the switching charge amount of the capacitor was lowered at all the applied voltages. From those results, it is considered that the PLZT film is completely crystallized by performing annealing at a temperature of 650° C. or higher and it is therefore difficult to compensate oxygen deficiency in the PLZT film by the second RTA. Thus, it is desirable that the temperature in the first RTA be 650° C. or lower.

(Seventh Experiment)

In the seventh experiment, the annealing process for crystallizing the ferroelectric film and the processes before that process were performed in a similar manner to that in the sixth experiment and thereafter a top electrode film was formed. Then, a cell array of ferroelectric capacitors and a discrete ferroelectric capacitor were formed. Furthermore, an alumina protection film was formed and thereafter one wiring layer was formed. Then, a switching charge amount and a leak current were measured. In annealing for crystallizing the ferroelectric film, the flow rate of O₂ gas was set to 25 sccm and the flow rate of Ar gas was 1980 sccm.

Figure 21:
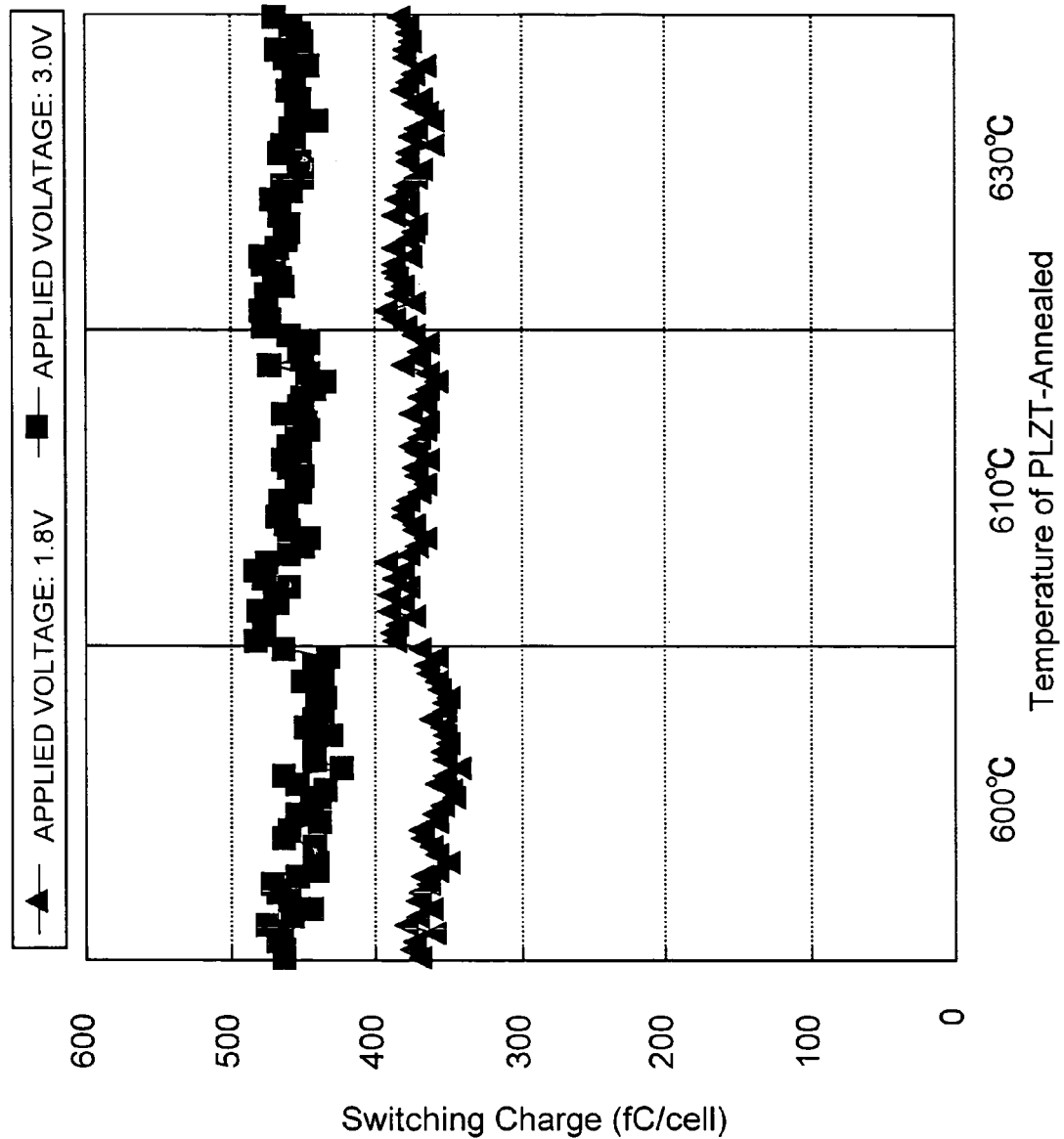
FIG. 21 is a graph showing the switching showing charge amount in a cell array.
Figure 22:
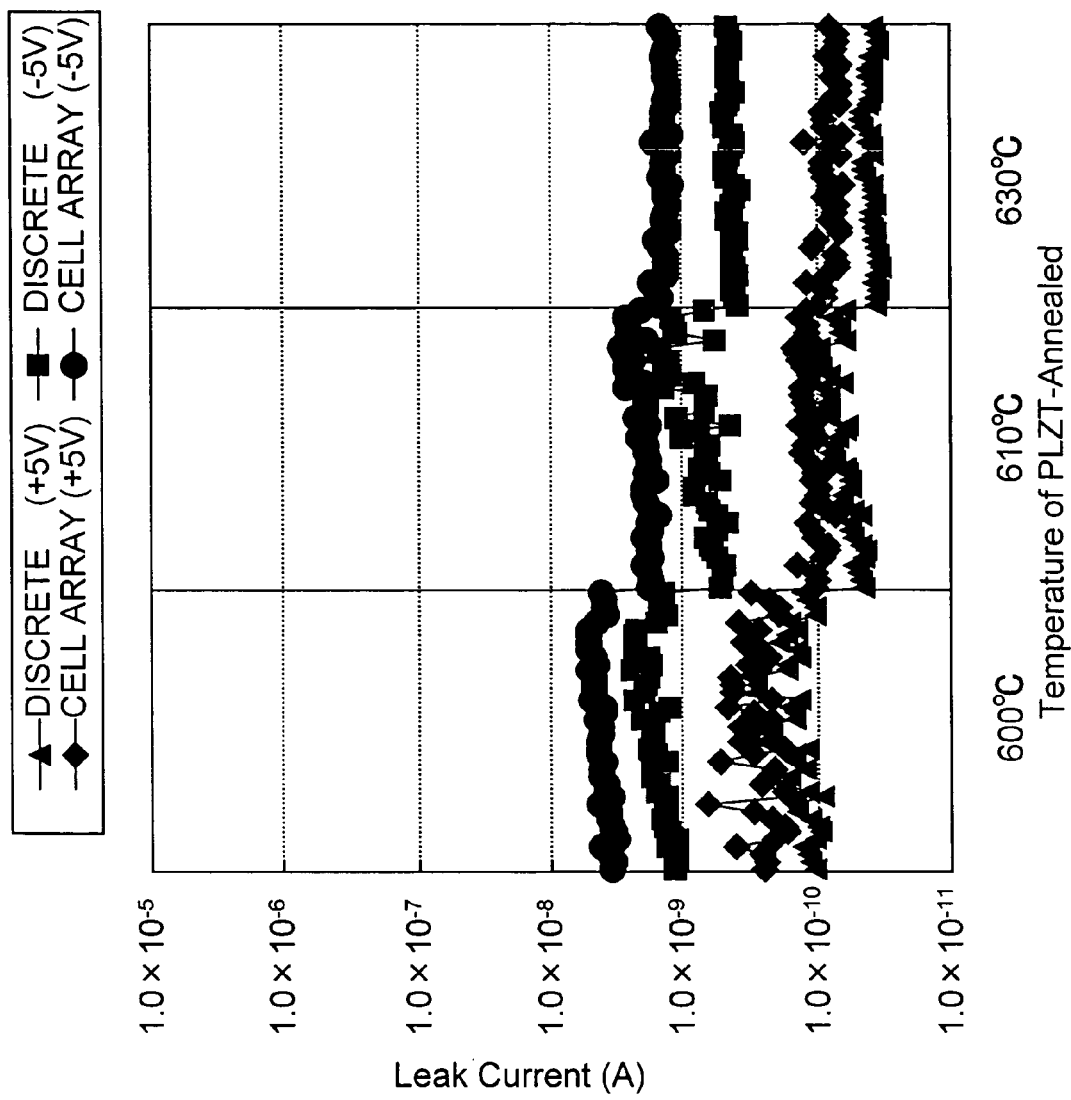
FIG. 22 is a graph showing leak currents in a cell array and a discrete ferroelectric capacitor.

FIG. 21 is a graph showing the measurement results of the switching charge amount in the cell array. FIG. 22 is a graph showing the measurement results of the leak current in the cell array and the discrete ferroelectric memory. In the measurement of the switching charge amount, an applied voltage was set to 1.8 V and 3 V. In the measurement of the leak current, an applied voltage was set to +5 V and −5 V. The switching charge amount when the applied voltage was 3 V changed little for an annealing temperature in a range of from 600° C. to 630° C. However, when the applied voltage was 1.8 V, the switching charge amount became larger slightly as the annealing temperature became higher. Moreover, the leak current was reduced with the increase of the annealing temperature.

(Eighth Experiment)

Figure 23:
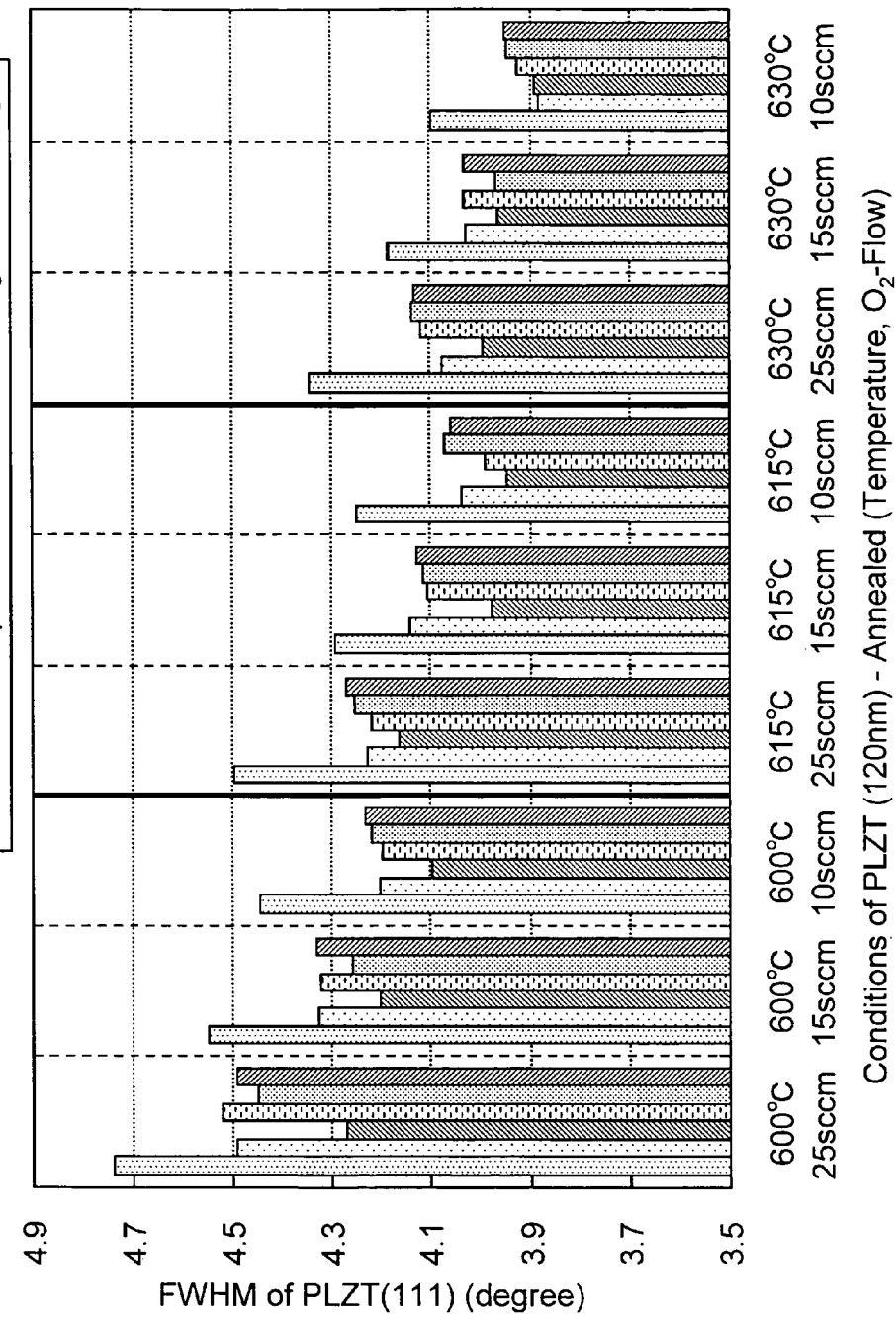
FIG. 23 is a graph showing a rocking curve full width at half maximum (FWHM) of a (111) plane.

In the eighth experiment, a ferroelectric film (thickness: 120 nm) was formed in accordance with the embodiment in various ways in a similar manner to that in the sixth experiment, and orientation of the ferroelectric film was observed. A condition for the first RTA performed for crystallizing the ferroelectric film (PLZT) was changed. A bottom electrode film was formed under the high-temperature condition (◆) in the first experiment. The first RTA for crystallization was performed for 90 seconds at various flow rates of O₂ gas and Ar gas and various temperatures. The second RTA was performed in an oxygen atmosphere at 750° C. Then, FWHM of a (111) plane of the PLZT film was obtained by four-axis X-ray diffraction. The result is shown in FIG. 23. In FIG. 23, "center" represents the peak intensity at a center of a wafer, "top" represents that at an upper portion of the wafer, "bottom" represents that at a lower portion of the wafer, "left" represents that at a left portion of the wafer, "right" represents that at a right portion of the wafer, and "average" represents an average value of the above peak intensities.

As shown in FIG. 23, as the flow rate of O₂ gas was smaller or the annealing temperature was higher, FWHM became smaller and the crystallinity was improved. For example, when the flow rate of O₂ gas was 25 sccm and the annealing temperature was 615° C. or higher, FWHM of 4.3 degrees or less, which was a good value, was obtained.

(Ninth Experiment)

In the ninth experiment, the annealing process for crystallizing the ferroelectric film and the processes before that process were performed in a similar manner to that in the eighth experiment and thereafter a top electrode film was formed. Then, a cell array and a discrete ferroelectric capacitor were formed. Furthermore, an alumina protection film was formed and thereafter one wiring layer was formed. Then, a switching charge amount, a leak current, and a coercive voltage Vc were measured.

Figure 24:
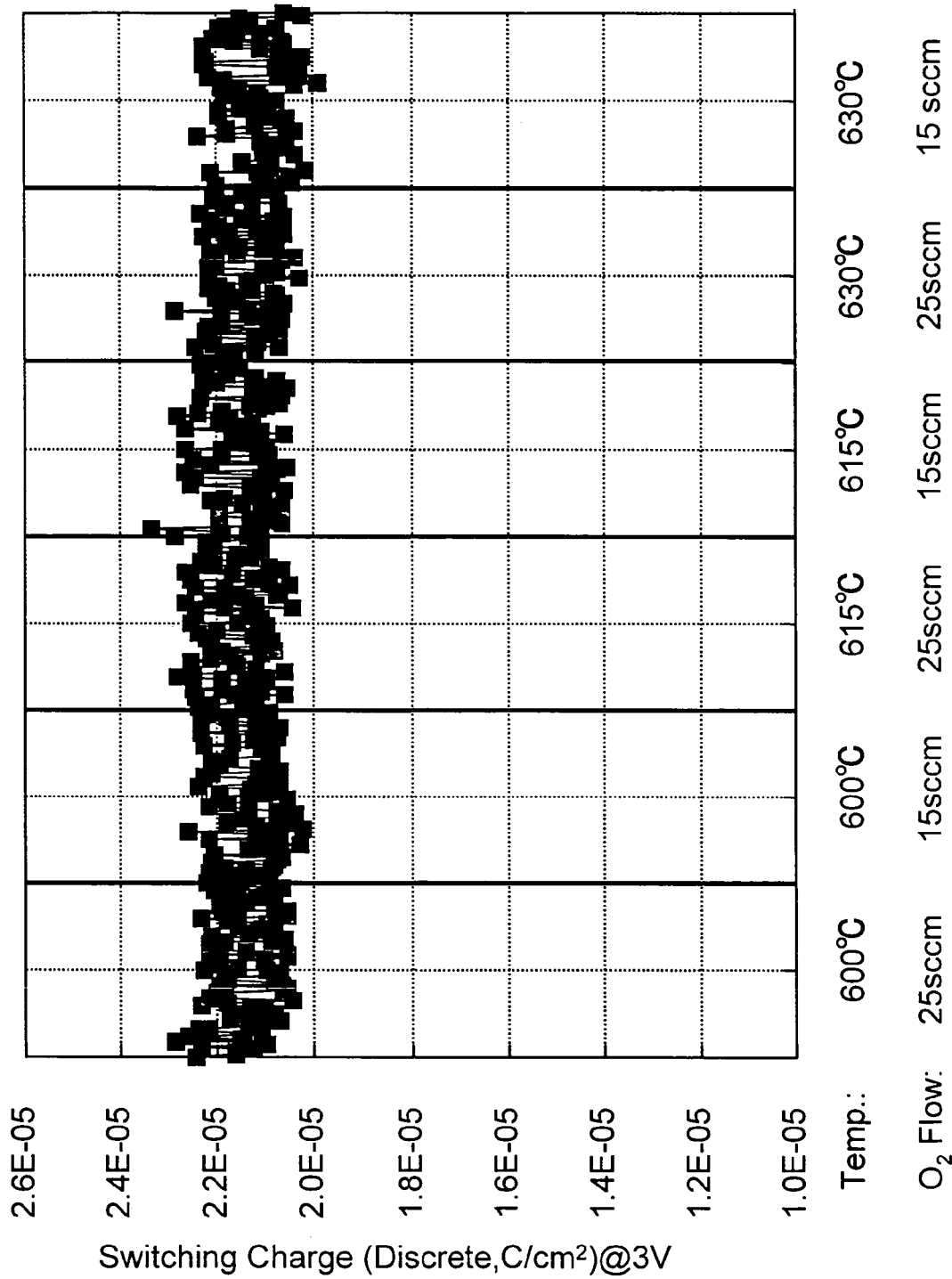
FIG. 24 is a graph showing the switching showing charge amount in a discrete ferroelectric capacitor.
Figure 25:
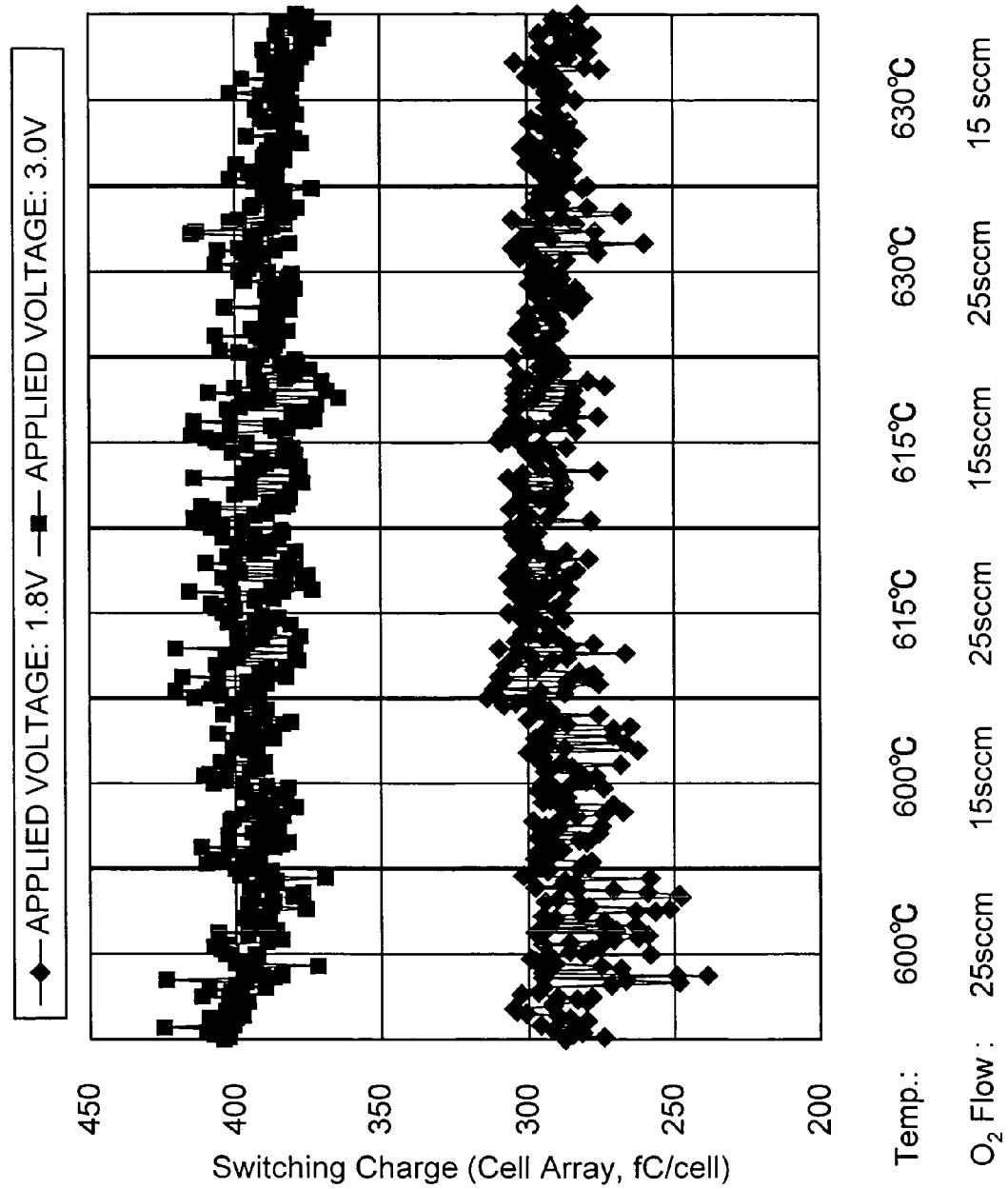
FIG. 25 is a graph showing the switching showing charge amount in a cell array.

FIGS. 24 and 25 are graphs showing the measurement results of the switching charge amount in the discrete ferroelectric capacitor and in the cell array, respectively. The switching charge amount in the discrete ferroelectric capacitor was measured when an applied voltage was set to 3.0 V. The switching charge amount in the cell array was measured when the applied voltage was set to 1.8 V and 3.0 V. As shown in FIGS. 24 and 25, when the annealing temperature was in a range of from 600° C. to 630° C. and the flow rate of O₂ gas was in a range of from 15 sccm to 25 sccm, the switching charge amount changed little.

Figure 26:
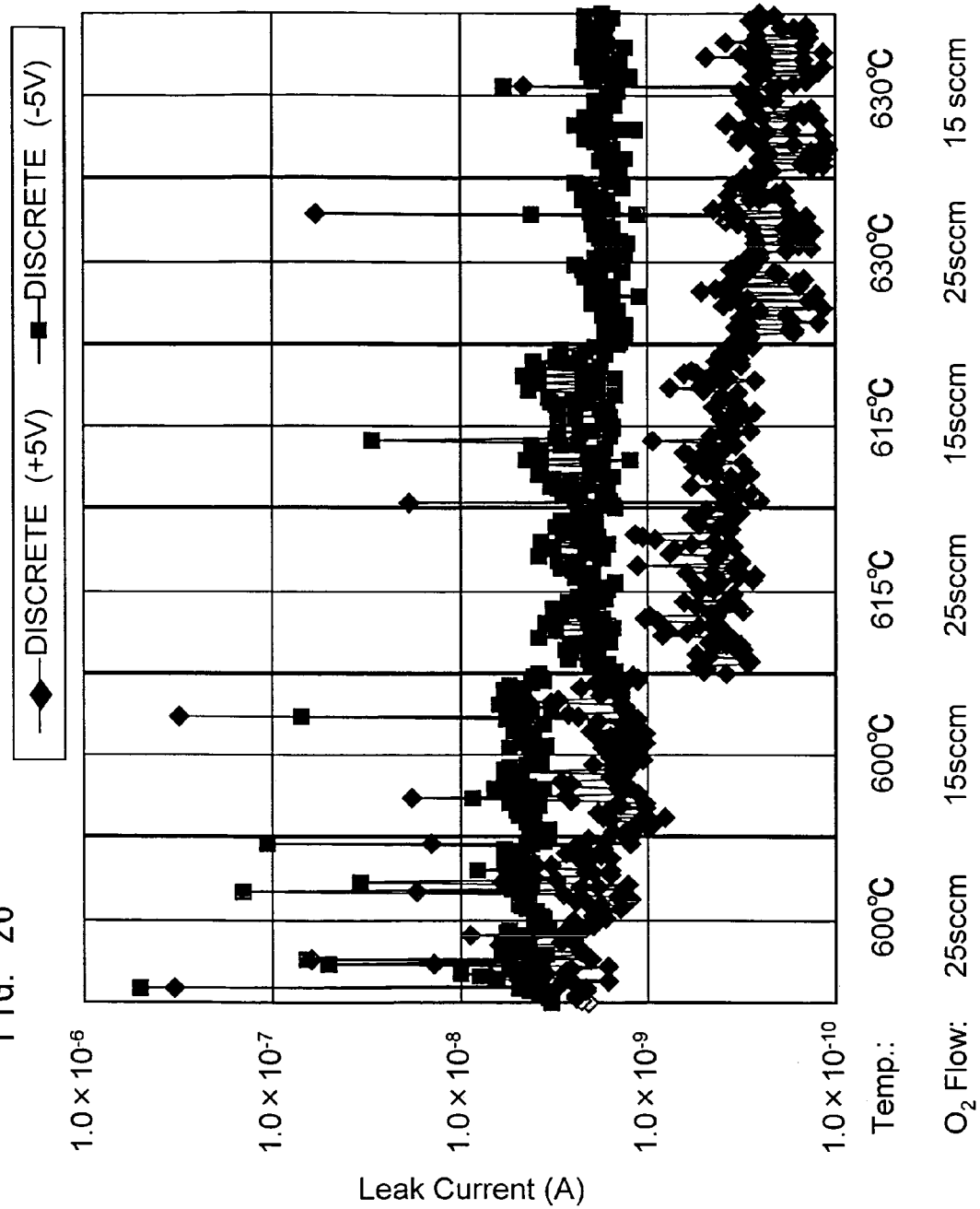
FIG. 26 is a graph showing a leak current in a discrete ferroelectric capacitor.

FIG. 26 is a graph showing the measurement result of the leak current in the discrete ferroelectric capacitor. In the measurement, an applied voltage was set to +5 V and −5 V. As shown in FIG. 26, the leak current was reduced as the annealing temperature became higher.

Figure 27:
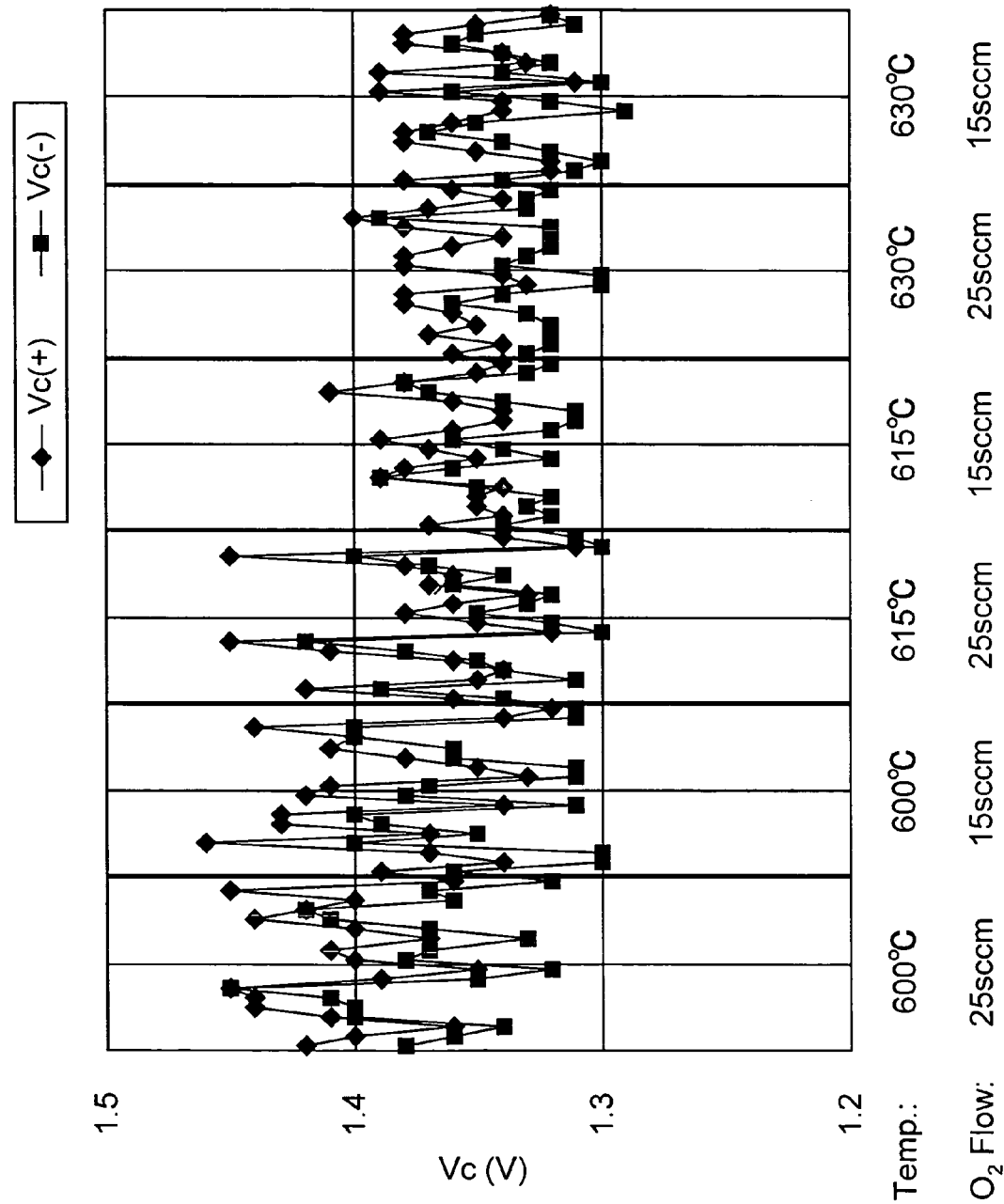
FIG. 27 is a graph showing a coercive voltage Vc.
Figure 35:
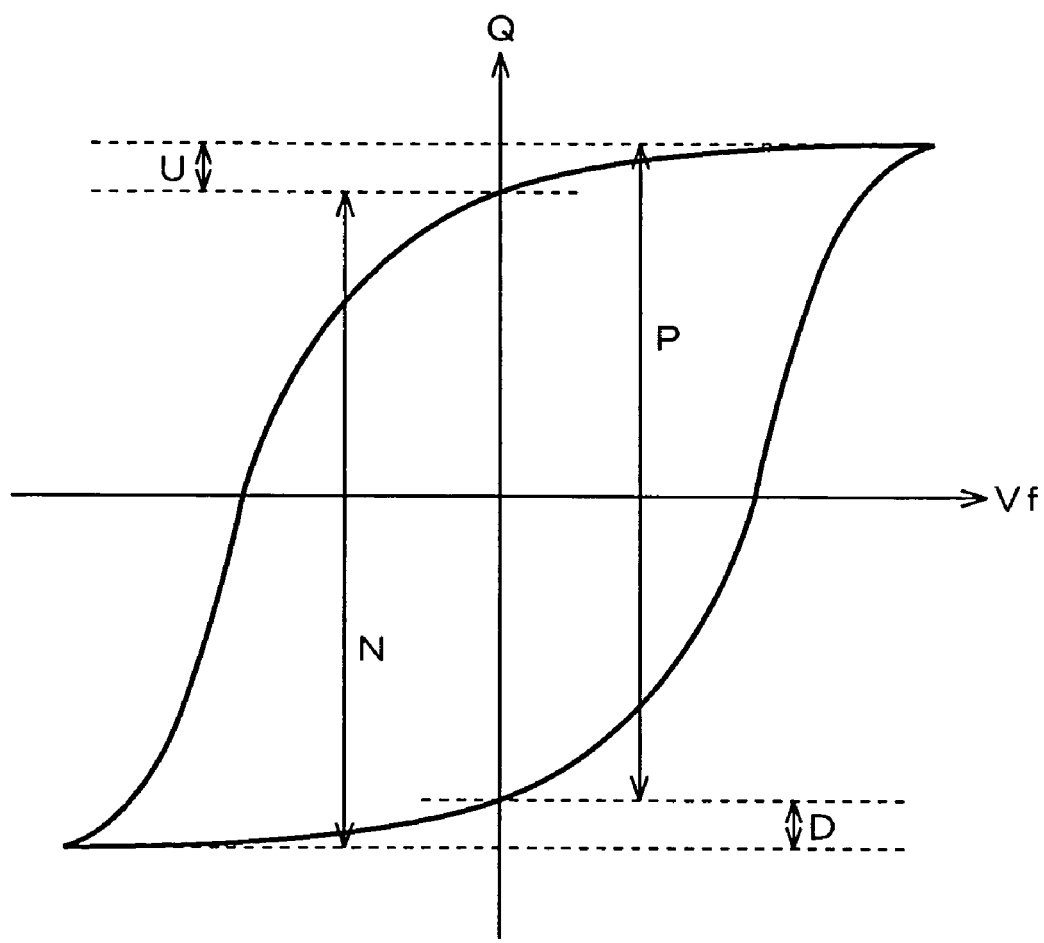
FIG. 35 is a diagram showing a hysteresis loop.

FIG. 27 is a graph showing the measurement result of the coercive voltage Vc. When the coercive voltage Vc was measured, a hysteresis loop representing a relationship between an applied voltage and polarization amount, as shown in FIG. 35, was obtained and various values were then obtained from that hysteresis loop. Then, a relationship between the applied voltage and Value P was obtained. An applied voltage at which a ratio of change of Value P to change of the applied voltage was the largest was determined as the coercive voltage. In FIG. 27, the symbol ◆ represents a coercive voltage Vc (+) in the case where the change ratio is positive and the symbol ■ represents a coercive voltage Vc(−) in the case where the change ratio is negative. In general, the lower coercive voltage Vc is more advantageous to a low voltage operation. As shown in FIG. 27, the coercive voltage was smaller than that obtained in the conventional technique under all the conditions. This tendency becomes more significant as the PLZT film became thinner.

(Tenth Experiment)

Figure 28:
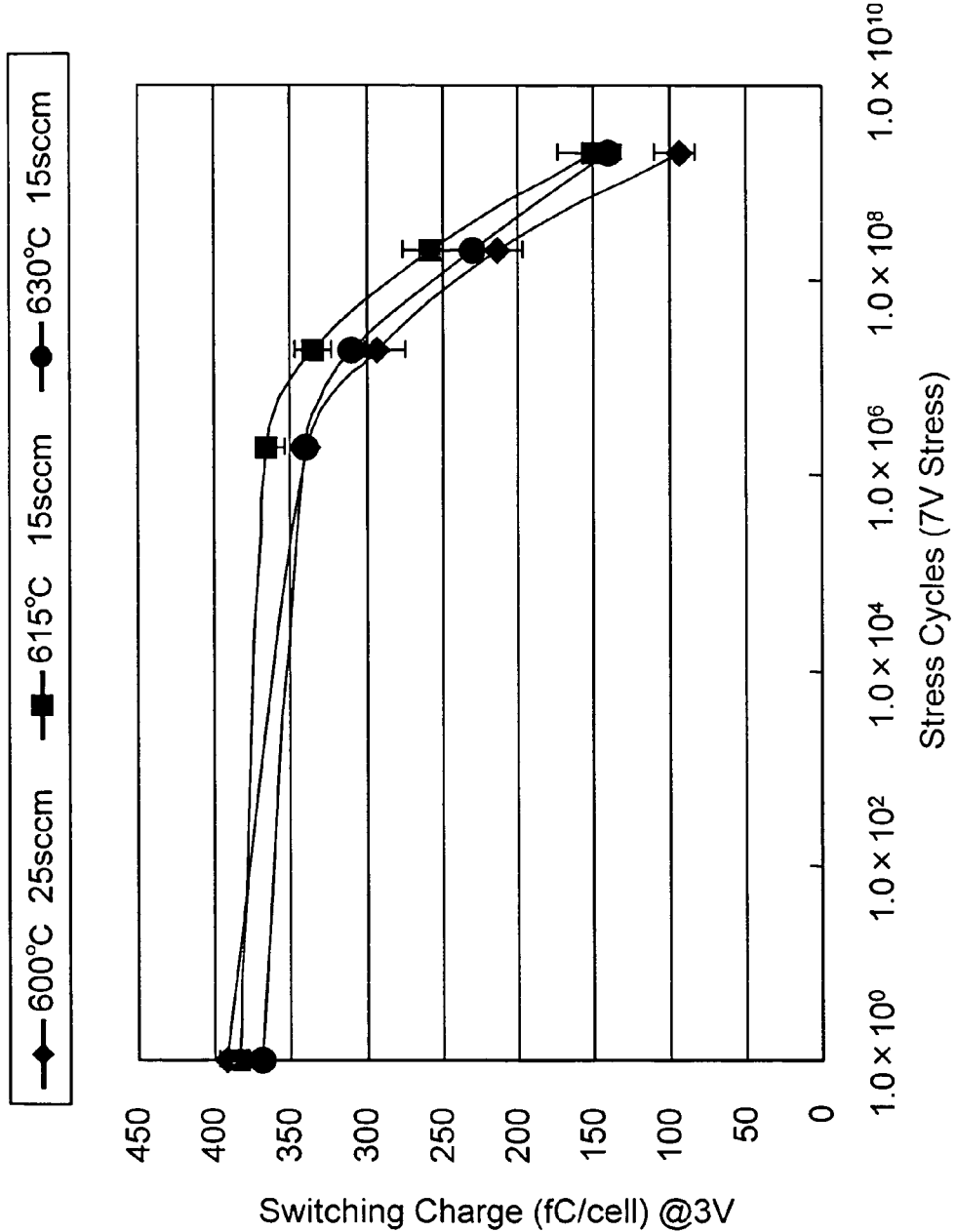
FIG. 28 is a graph showing fatigue loss in cell array samples.

In the tenth experiment, fatigue loss (dependency on a stress cycle) in the cell array sample manufactured in the ninth experiment was examined. In this experiment, a reading voltage and a stress voltage were set to 3 V and 7 V, respectively. The result of this experiment is shown in FIG. 28. In general, fatigue loss is suppressed to be low as the crystallinity of the PLZT film is better.

As shown in FIG. 28, in the case where the first annealing was performed under a condition where the temperature was 600° C. and the flow rate of O₂ gas was 25 sccm, fatigue loss of 76% in 2×10⁹ cycles was obtained with respect to an initial value as reference. On the other hand, fatigue loss of 61% was obtained in the case where the first annealing was performed under a condition where the temperature was 615° C. and the flow rate of $O_2$ gas was 15 sccm, and fatigue loss of 62% was obtained in the case where the first annealing was performed under a condition where the temperature was 630° C. and the flow rate of $O_2$ gas was 15 sccm. FWHM of a (111) plane of the PLZT film measured for the sample manufactured under the former condition was 4.49 degrees, whereas FWHM measured for the sample manufactured under the latter conditions was 4.13 degrees or less. From those results, it can be considered that fatigue loss can be reduced when FWHM is made equal to or smaller than 4.2 degrees.

(Eleventh Experiment)

In the eleventh experiment, imprint characteristics were examined for the cell array samples manufactured in the ninth experiment. More specifically, the imprint characteristics were estimated by OS_Rate after a heat treatment was performed for 504 hours. As an absolute value of OS_Rate is smaller, imprinting is less likely to occur.

Figure 29:
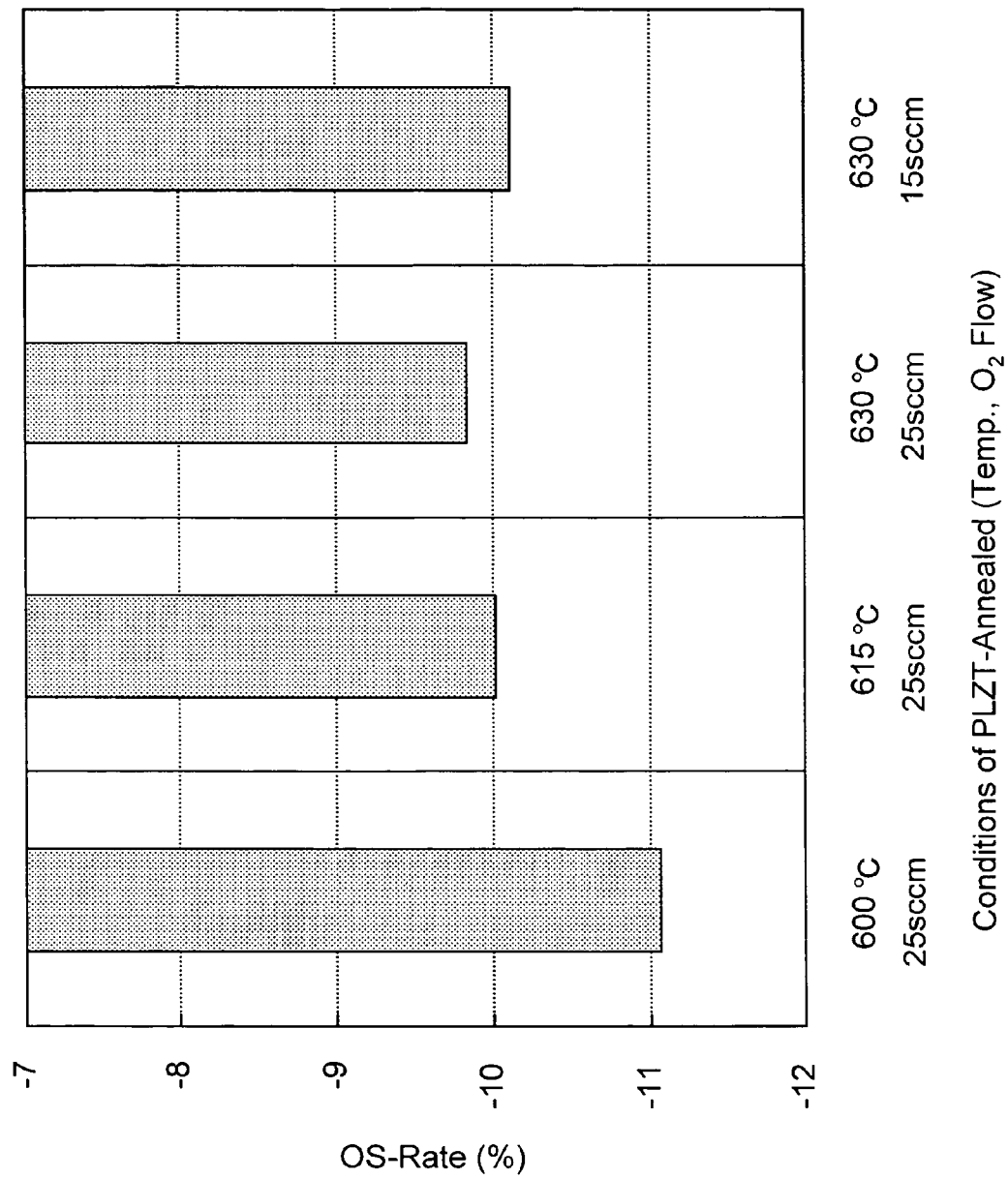
FIG. 29 is a graph showing imprint characteristics.

The result of this experiment is shown in FIG. 29. FIG. 29 shows the worst values for the respective samples. As shown in FIG. 29, when the sample obtained under the condition where the annealing temperature was 600° C. and the flow rate of $O_2$ gas was 25 sccm was compared with the other samples, better results were obtained for the other samples by about 10%. This means that the absolute value of OS_Rate is smaller and imprinting is less likely to occur, as FWHM of the PLZT film is smaller.

(Twelfth Experiment)

In the twelfth experiment, a PLZT film was formed and annealed to be crystallized in accordance with the embodiment in various ways. In the first sample, the thickness of the PLZT film was set to 150 nm and the first RTA was performed under a condition where the flow rate of Ar gas was 1980 sccm, the flow rate of $O_2$ gas was 25 sccm, the temperature was 600° C., and the duration was 90 seconds. In the second sample, the thickness of the PLZT film was set to 150 nm and the first RTA was performed under a condition where the flow rate of Ar gas was 1980 sccm, the flow rate Of $O_2$ gas was 25 sccm, the temperature was 630° C., and the duration was 90 seconds. In the third sample, the thickness of the PLZT film was set to 120 nm and the first RTA was performed under a condition where the flow rate of Ar gas was 1980 sccm, the flow rate Of $O_2$ gas was 15 sccm, the temperature was 630° C., and the duration was 90 seconds. The second RTA was performed in an oxygen atmosphere at 750° C. Then, FWHM of a (111) plane of the PLZT film was obtained by four-axis X-ray diffraction. Average values obtained for five in-plane points of the above samples were 4.40 degrees, 3.96 degrees, and 4.04 degrees, respectively.

Figure 30:
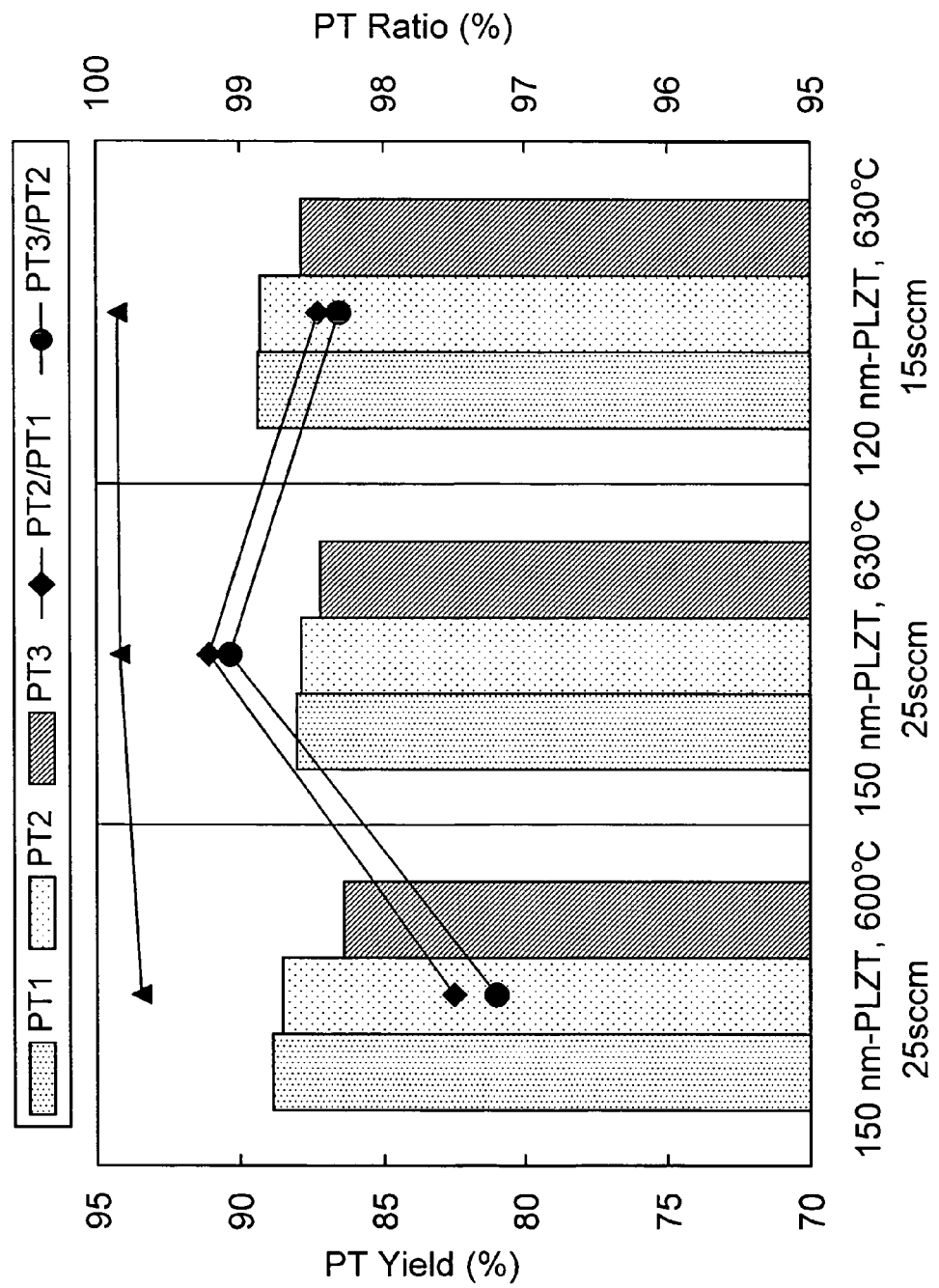
FIG. 30 is a graph showing an yield.
Figure 31:
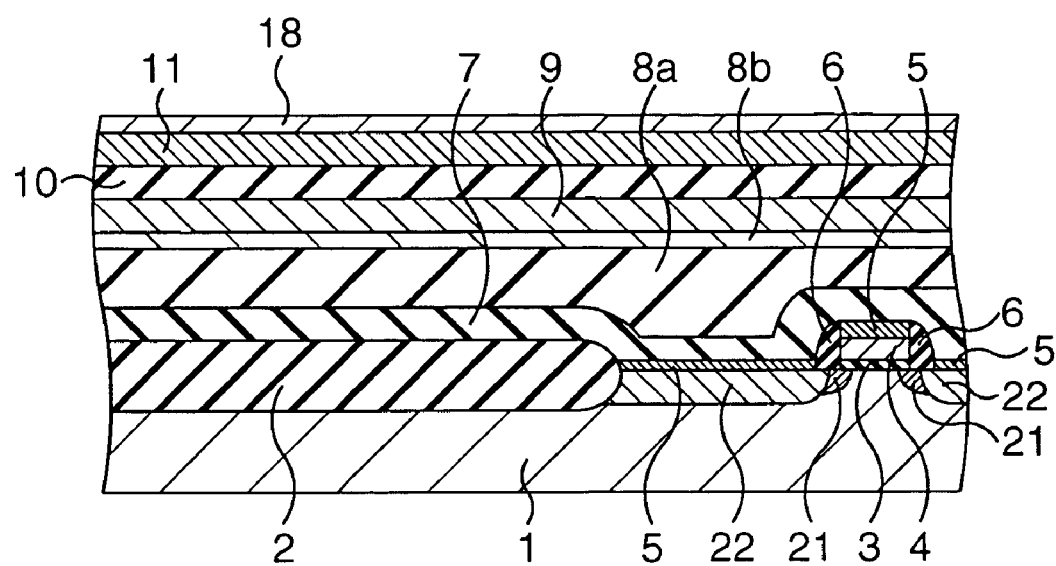
FIG. 31 is a cross-sectional view showing another embodiment of the present invention.
Figure 32:
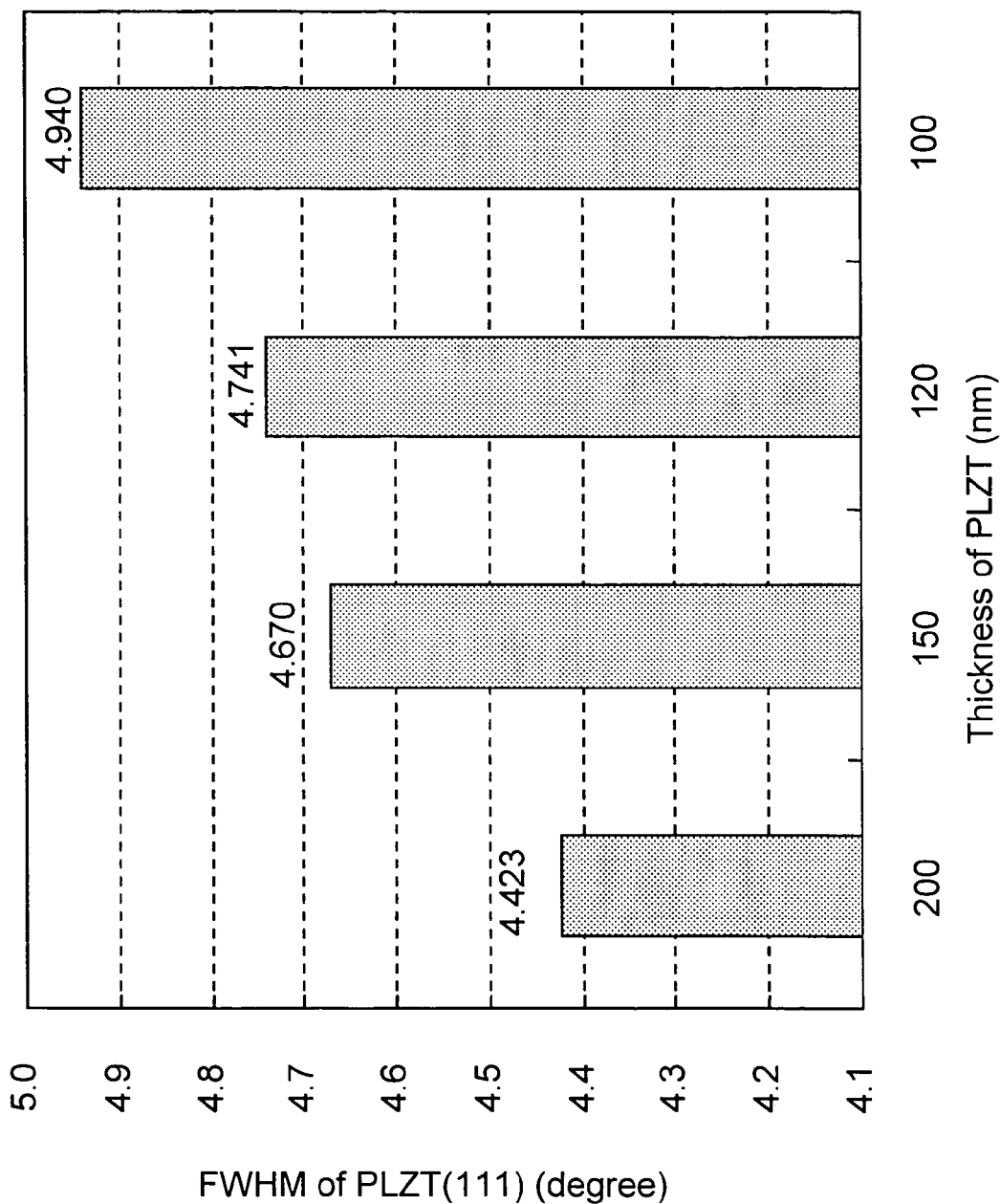
FIG. 32 is a graph showing a rocking curve full width at half maximum of a (111) plane (conventional technique).
Figure 33:
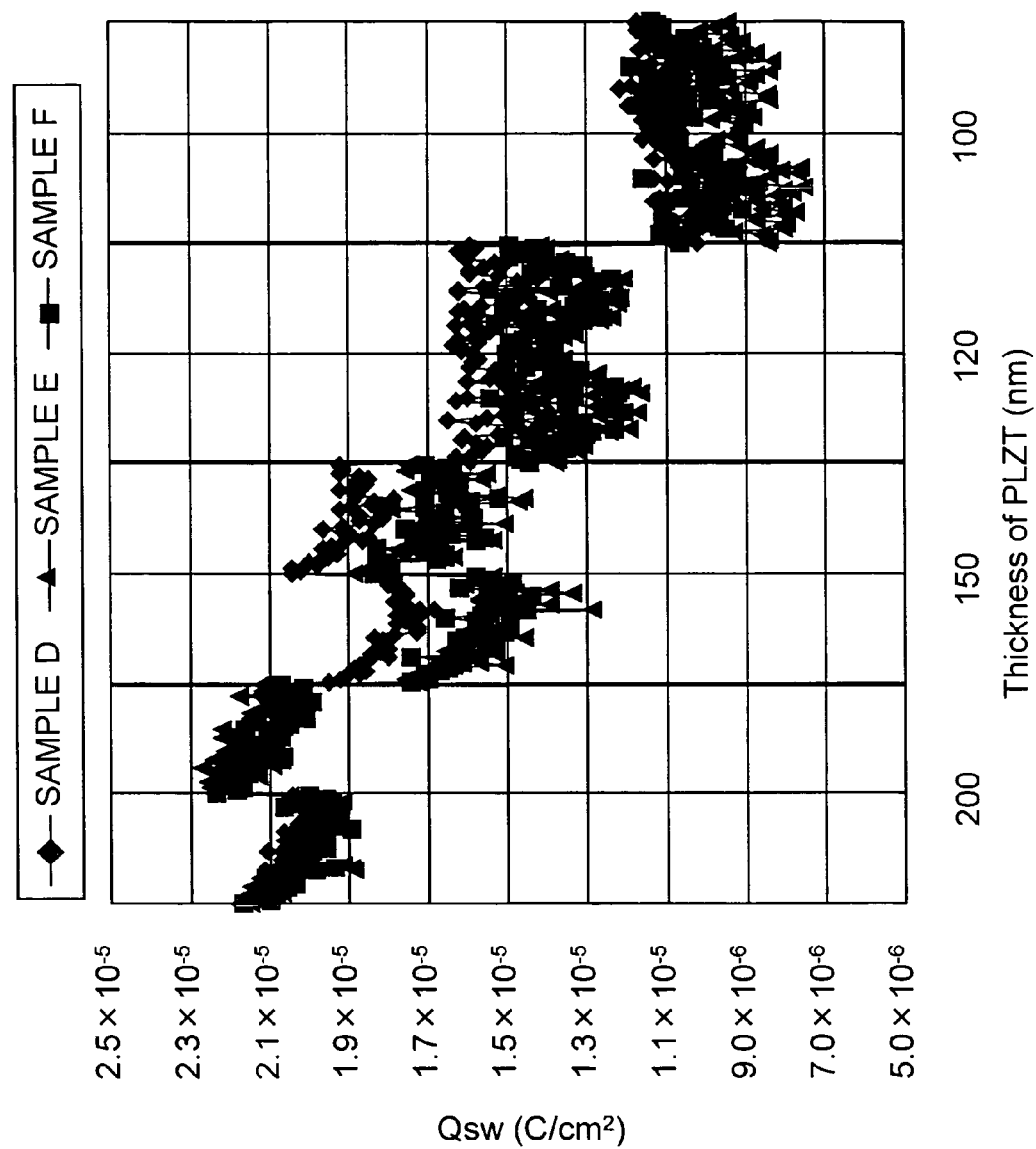
FIG. 33 is a graph showing the switching charge amount (conventional technique).
Figure 34:
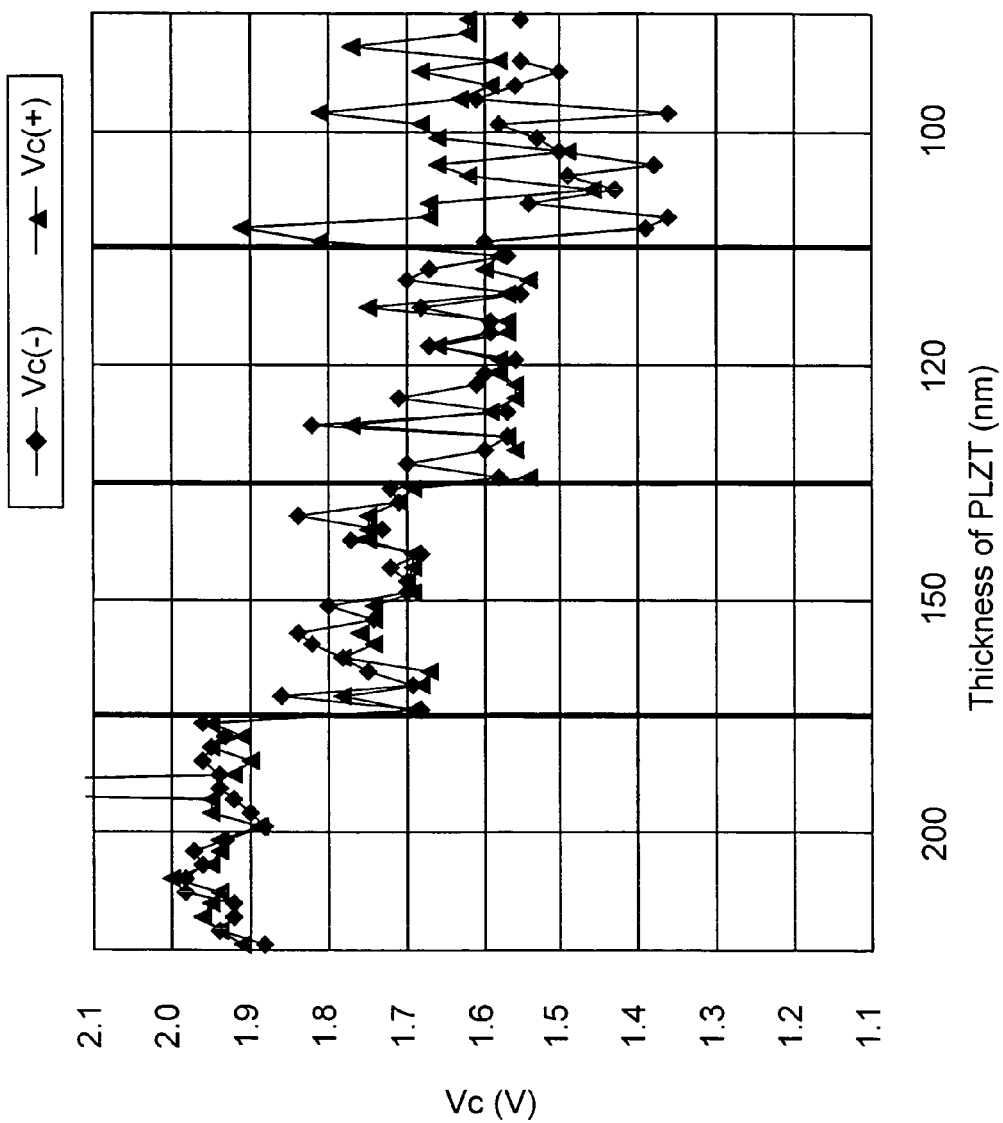
FIG. 34 is a graph showing a coercive voltage Vc (conventional technique).

Subsequently, a top electrode film was formed, a ferroelectric capacitor was formed, the alumina protection film was formed, and three wiring layers were formed. Then, an initial yield was measured for each sample in a similar manner to that described in the fifth experiment. The measurement result is shown in FIG. 30. The legend notes in FIG. 18 can be also applied in FIG. 30. As shown in FIG. 30, as FWHM was smaller, a PT ratio was higher.

As a method for forming a ferroelectric film, a sol-gel method, MOD (Metal Organic Decomposition), CSD (Chemical Solution Deposition), CVD (Chemical Vapor Deposition), and epitaxial growth can be used other than sputtering and MOCVD. Moreover, as the ferroelectric film, a film in which its crystalline structure is a Bi-layered structure or a perovskite structure can be formed by a heat treatment. For example, other than PZT, PZT lightly doped with La, Ca, Sr, and/or Si, SBT, BLT and Bi-layered compounds generally represented by $ABO_3$ can be considered. In addition, a high dielectric constant film such as a zirconium oxide film or a film containing Pb may be formed, instead of the ferroelectric film.

When the lowermost layer of the top electrode film is formed, sputtering using target that contains platinum, iridium, ruthenium, rhodium, rhenium, osmium, and/or palladium can be performed under a condition where oxidation of those noble metal elements occurs. Especially, in case of forming an iridium oxide film, it is preferable that a deposition temperature be in a range of from 20° C. to 400° C., for example, 300° C., and it is also preferable that a partial pressure of oxygen gas to a pressure of oxygen gas and inert gas that form sputter gas be in a range of from 10% to 60%.

The conductive film formed on the initial layer of the top electrode film is not limited to an $IrO_x$, film. Alternatively, a metal film containing a noble metal element such as platinum (Pt), iridium (Ir), ruthenium (Ru), rhodium (Rh), rhenium (Re), osmium (Os) and/or palladium (Pd) may be formed, or a film of oxide of those noble metal elements, e.g., an $SrRuO_3$ film may be formed. A film formed by two or more layers may be formed as the conductive film.

The second heat treatment may be performed in an oxygen atmosphere. The second heat treatment may be performed at a temperature range of from 725° C. to 775° C. The rocking curve full width at half maximum for the (111) plane of the high dielectric constant film may be equal to or smaller than 4.2 degrees.

According to the present invention, the flow rate of the oxidizing gas in the heat treatment is set appropriately. Thus, orientation of the high dielectric constant film such as the ferroelectric film can be made favorable. Therefore, even when the high dielectric constant film such as the ferroelectric film is formed to be thin, its characteristics can be sufficiently brought out.

What is claimed is:

1. A method for manufacturing a semiconductor device comprising the steps of:

forming a bottom electrode film;

forming a high dielectric constant film on the bottom electrode film;

performing a heat treatment in an oxidizing atmosphere for the high dielectric constant film to crystallize the high dielectric constant film, a flow rate of an oxidizing gas being set to be in a range of from 10 sccm to 100 sccm during the heat treatment; and forming a top electrode film on the high dielectric constant film;

wherein a rocking curve full width at half maximum for a (111) plane of the high dielectric constant film is equal to or smaller than 4.6 degrees.

2. The method for manufacturing a semiconductor device according to claim 1, wherein the flow rate of the oxidizing gas is set to 50 sccm or less.

3. The method for manufacturing a semiconductor device according to claim 1, wherein the oxidizing gas is one selected from a group consisting of $O_2$ gas, $O_3$ gas, and $N_2O$ gas.

4. The method for manufacturing a semiconductor device according to claim 1, wherein an inert gas is supplied at a flow rate of 1500 sccm or more during the heat treatment.

5. The method for manufacturing a semiconductor device according to claim 4, wherein the inert gas is one selected from a group consisting of Ar gas, $N_2$ gas, and He gas.

6. The method for manufacturing a semiconductor device according to claim 1, wherein the heat treatment is performed at a temperature of 550° C. or higher.

7. The method for manufacturing a semiconductor device according to claim 6, wherein the heat treatment is performed at a temperature range of from 580° C. to 650° C.

8. The method for manufacturing a semiconductor device according to claim 1, wherein the high dielectric constant film is a ferroelectric film.

9. The method for manufacturing a semiconductor device according to claim 1, further comprising the step of performing a second heat treatment for the high dielectric constant film at a higher temperature than a temperature in the heat treatment, between said step of performing a heat treatment and said step of forming a top electrode film.

10. The method for manufacturing a semiconductor device according to claim 9, wherein the second heat treatment is performed in an atmosphere in which an oxygen concentration is 50% or more.

11. The method for manufacturing a semiconductor device according to claim 9, wherein the second heat treatment is performed at a temperature of 650° C. or higher.

12. The method for manufacturing a semiconductor device according to claim 1, further comprising the step of forming a conductive film on the top electrode film after said step of forming a top electrode film.

13. The method for manufacturing a semiconductor device according to claim 1, wherein a thickness of the high dielectric constant film is 150 nm or less.

14. The method for manufacturing a semiconductor device according to claim 1, wherein the high dielectric constant film is an amorphous film or a microcrystalline film.

15. A method for manufacturing a semiconductor device comprising the steps of:

forming a bottom electrode film;

forming a high dielectric constant film on the bottom electrode film;

performing a first heat treatment in a mixed atmosphere of an oxidizing gas and an inert gas to crystallize the high dielectric constant film, a flow rate of the oxidizing gas being lower than 50 sccm, and a flow rate of the inert gas being 1500 sccm or more;

forming a first top electrode film on the high dielectric constant film;

performing a second heat treatment in an oxidizing atmosphere; and forming a second top electrode film on the first top electrode film;

wherein a rocking curve full width at half maximum for a (111) plane of the high dielectric constant film is equal to or smaller than 4.6 degrees.

16. The method for manufacturing a semiconductor device according to claim 15, wherein the first heat treatment is performed at a temperature range of from 540° C. to 620° C.

17. The method for manufacturing a semiconductor device according to claim 15, wherein the first heat treatment is performed at 585° C.

18. The method for manufacturing a semiconductor device according to claim 15, wherein one or more of metal films or metal oxide conductive films that contain at least one selected from a group consisting of platinum, iridium, ruthenium, rhodium, and $SrRuO_3$ are formed as the first top electrode film.

19. The method for manufacturing a semiconductor device according to claim 15, wherein the second heat treatment is performed at a temperature of 650° C. or higher.

* * * * *